United States Patent
Sugishima et al.

(10) Patent No.: US 9,809,746 B2
(45) Date of Patent: Nov. 7, 2017

(54) ETCHING LIQUID, KIT OF SAME, ETCHING METHOD USING SAME, METHOD FOR PRODUCING SEMICONDUCTOR SUBSTRATE PRODUCT, AND METHOD FOR MANUFACTURING SEMICONDUCTOR ELEMENT

(71) Applicant: FUJIFILM Corporation, Tokyo (JP)

(72) Inventors: Yasuo Sugishima, Shizuoka (JP); Atsushi Mizutani, Shizuoka (JP); Keeyoung Park, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/956,500

(22) Filed: Dec. 2, 2015

(65) Prior Publication Data
US 2016/0083650 A1    Mar. 24, 2016

Related U.S. Application Data

(63) Continuation of application No. PCT/JP2014/064429, filed on May 30, 2014.

(30) Foreign Application Priority Data

Jun. 4, 2013 (JP) ................................ 2013-117911
Jul. 25, 2013 (JP) ................................ 2013-154769
Dec. 27, 2013 (JP) ................................ 2013-273291

(51) Int. Cl.
*C09K 13/06* (2006.01)
*C09K 13/08* (2006.01)
*H01L 21/3213* (2006.01)

(52) U.S. Cl.
CPC ........ *C09K 13/08* (2013.01); *H01L 21/32134* (2013.01)

(58) Field of Classification Search
CPC ........... H01L 21/32134; H01L 21/3213; H01L 21/32137; H01L 21/30604;
(Continued)

(56) References Cited

U.S. PATENT DOCUMENTS

2004/0060906 A1*  4/2004  Bachrach ............ H01L 21/6708
                                                    216/92
2004/0126914 A1*  7/2004  Chang ................. H01L 27/1214
                                                    438/30
(Continued)

FOREIGN PATENT DOCUMENTS

JP       60-163438 A      8/1985
JP       2002-115083 A    4/2002
(Continued)

OTHER PUBLICATIONS

Communication (Notification of Reasons for Refusal) issued on Aug. 30, 2016 from the Japanese Patent Office for counterpart Japanese Application No. 2014-110203.
(Continued)

*Primary Examiner* — Lan Vinh
(74) *Attorney, Agent, or Firm* — Sughrue Mion, PLLC

(57) ABSTRACT

There is provided an etching liquid including nitric acid; a fluorine-containing compound; and a nitrogen-containing organic compound A containing a nitrogen atom, or a phosphorus-containing compound B.

22 Claims, 2 Drawing Sheets

(58) Field of Classification Search
CPC ... H01L 21/30608; C09K 13/00; C09K 13/04; C09K 13/08
USPC ...... 252/79.1, 79.2, 79.3; 216/102, 103, 104
See application file for complete search history.

(56) References Cited

U.S. PATENT DOCUMENTS

| | | | |
|---|---|---|---|
| 2004/0224866 A1 | 11/2004 | Matsunaga et al. | |
| 2008/0160743 A1* | 7/2008 | Lee | C11D 3/042 |
| | | | 438/591 |
| 2008/0210900 A1* | 9/2008 | Wojtczak | H01L 21/31111 |
| | | | 252/79.3 |
| 2009/0137191 A1* | 5/2009 | Lee | B08B 1/007 |
| | | | 451/36 |
| 2010/0021688 A1* | 1/2010 | Katoh | H01L 21/02008 |
| | | | 428/141 |
| 2010/0159698 A1* | 6/2010 | McConnell | C09G 1/02 |
| | | | 438/693 |
| 2012/0042902 A1* | 2/2012 | Uenda | B08B 1/00 |
| | | | 134/8 |
| 2012/0231632 A1 | 9/2012 | Takahashi et al. | |
| 2013/0178065 A1* | 7/2013 | Shi | C09G 1/02 |
| | | | 438/693 |
| 2013/0270217 A1* | 10/2013 | Yoshida | C23F 1/18 |
| | | | 216/13 |

FOREIGN PATENT DOCUMENTS

| | | |
|---|---|---|
| JP | 2004-200638 A | 7/2004 |
| JP | 2005-150236 A | 6/2005 |
| JP | 2005-303305 A | 10/2005 |
| JP | 2006-114884 A | 4/2006 |
| JP | 2009-74142 A | 4/2009 |
| JP | 2009-206462 A | 9/2009 |
| JP | 2013-55087 A | 3/2013 |
| JP | 2013-102089 A | 5/2013 |

OTHER PUBLICATIONS

International Search Report for PCT/JP2014/064429 dated Sep. 2, 2014.

* cited by examiner

ETCHING LIQUID, KIT OF SAME, ETCHING METHOD USING SAME, METHOD FOR PRODUCING SEMICONDUCTOR SUBSTRATE PRODUCT, AND METHOD FOR MANUFACTURING SEMICONDUCTOR ELEMENT

CROSS-REFERENCE TO RELATED APPLICATIONS

This application is a Continuation of PCT International Application No. PCT/JP2014/064429 filed on May 30, 2014, which claims priority under 35 U.S.C. §119 (a) to Japanese Patent Application No. 2013-117911 filed in Japan on Jun. 4, 2013, Japanese Patent Application No. 2013-154769 filed in Japan on Jul. 25, 2013, and Japanese Patent Application No. 2013-273291 filed in Japan on Dec. 27, 2013. Each of the above applications is hereby expressly incorporated by reference, in its entirety, into the present application.

BACKGROUND OF THE INVENTION

1. Field of the Invention

The present invention relates to an etching liquid, a kit of the same, an etching method using the same, a method for producing a semiconductor substrate product, and a method for manufacturing a semiconductor element.

2. Description of the Related Art

The structural design of a semiconductor element has increasingly diversified and applications of structures or materials which have not been employed are being attempted every day. In response to the current situation, a new breakthrough is required for a technique of producing a semiconductor element and the need thereof has been dealt with by fusing techniques of electrical and electronic materials as well as a wide range of techniques of manufacturing devices and optical or chemical fields.

Processes of producing a semiconductor include a wide range of processes. The processes thereof include forming a metal-containing layer by carrying out CVD or the like, applying a resist film, carrying out photolithography, etching a metal-containing layer, polishing, and washing away a residue. Among these, as a process for which a technique related to chemistry is required, wet etching using a liquid chemical is exemplified. Specifically, it is desired that an etching liquid suitable for various metals such as silicon, germanium, titanium, tungsten, cobalt, and a complex compound of these which are formed in respective processes or the complex compounds thereof are formulated and then the removal thereof is managed. In some cases, a member exposed at the time of etching remains as it is without being removed and is not damaged, which means selectivity of etching is required.

SUMMARY OF THE INVENTION

The present applicant filed an application suggesting a method of selectively etching a silicon-containing layer without damaging a titanium-containing layer earlier (JP2013-055087A). This method has an advantage of being able to be compatible with producing a substrate having fine irregularities such as a capacitor. The present inventors have further advanced the research and examined formulations or the like of an etching liquid which can improve selectivity of etching a titanium-containing layer and a silicon-containing layer and, on the contrary, can appropriately remove the titanium-containing layer. In addition, the present inventors have examined changing a ratio ($\eta$) of an etching rate of the silicon-containing layer to that of the titanium-containing layer by adjusting components or compositions as needed.

Here, an object of the present invention is to provide an etching liquid which can appropriately remove (preferably with high selectivity) a titanium-containing layer and a silicon-containing layer while suppressing surface roughness after etching, a kit of the same, an etching method using the same, a method of producing a semiconductor substrate product, and a method for manufacturing a semiconductor element. Further, another object thereof is to provide an etching liquid which can change the ratio ($\eta$) of the etching rate of the silicon-containing layer to the titanium-containing layer while appropriately controlling the ratio thereof without excessively decreasing the etching rate of the silicon-containing layer as needed, a kit of the same, an etching method using the same, a method of producing a semiconductor substrate product, and a method for manufacturing a semiconductor element.

The above-described problems are solved by the following means.

[1] An etching liquid including: nitric acid; a fluorine-containing compound; and a nitrogen-containing organic compound A containing a nitrogen atom, or a phosphorus-containing compound B.

[2] The etching liquid according to [1], in which the molecular weight of the nitrogen-containing organic compound is in the range of 100 to 20,000.

[3] The etching liquid according to [1] or [2], in which the molecular weight of the nitrogen-containing organic compound is in the range of 1,000 to 20,000.

[4] The etching liquid according to [1] or [2], in which 0.01 parts by mass to 25 parts by mass of the nitrogen-containing organic compound is contained based on 100 parts by mass of the fluorine-containing compound.

[5] The etching liquid according to any one of [1] to [4], in which the concentration of the nitrogen-containing organic compound is in the range of 0.0001% by mass to 5% by mass.

[6] The etching liquid according to any one of [1] to [5], in which the nitrogen-containing organic compound is a compound including a repeating unit represented by any one of the following Formulae a-1 to a-8 or a compound represented by the following Formula b.

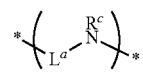

a-1

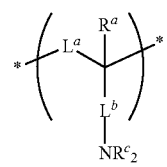

a-2

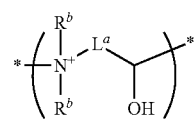

a-3

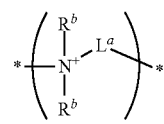

a-4

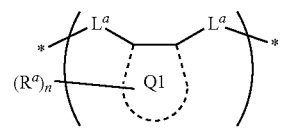

a-5

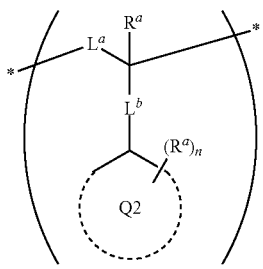

a-6

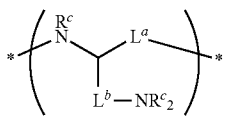

a-7

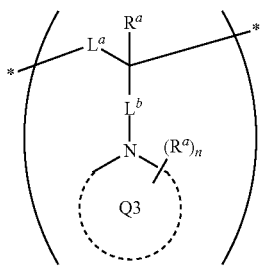

a-8

$R^a$ represents a hydrogen atom, an alkyl group, an alkenyl group, an aryl group, or a heterocyclic group. $R^b$ represents an alkyl group, an alkenyl group, or an aryl group, $L^a$ represents an alkylene group, a carbonyl group, an imino group, an arylene group, a heterocyclic group, or a combination of these. $L^b$ represents a single bond, an alkylene group, a carbonyl group, an imino group, an arylene group, a heterocyclic group, or a combination of these. $R^c$ represents a hydrogen atom or an alkyl group. n represents an integer of 0 or greater. The upper limit of n is a number of respective substitutable cyclic structural portions. Rings Q1 to Q3 represent a nitrogen-containing heterocycle. The symbol "*" in the formula indicates a binding position.

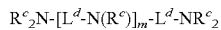   b

In the formula, $R^c$ has the same definition as that described above. m represents an integer of 0 or greater. $L^d$ represents an alkylene group, a carbonyl group, an imino group, an arylene group, a heterocyclic group, or a combination of these. A plurality of $R^c$'s and $L^d$'s may be the same as or different from each other. A plurality of $R^c$'s and $L^d$'s may be bonded to each other to form a ring.

[7] The etching liquid according to any one of [1] to [6], in which the nitrogen-containing organic compound is polyethyleneimine, polyvinylamine, polyallylamine, polyvinylimidazole, polyhexadimethrine, poly(4-vinylpyridine), polyhistidine, polyarginine, polydimethyl diallyl ammonium, polylysine, polyornithine, diethylenetriamine, tetraethylenepentamine, pentaethylenehexamine, or polydiallylamine, or the phosphorus-containing compound is phosphoric acid, phosphonic acid, phenylphosphonic acid, dodecylphosphoric acid, 1-hydroxyethane-1,1-bis(phosphonic acid), or diphosphoric acid.

[8] The etching liquid according to any one of [1] to [7], in which the phosphorus-containing compound is a compound represented by the following Formula B1 or B2,

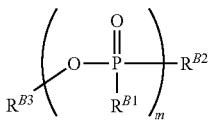   B1

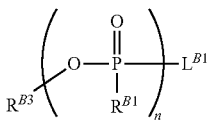   B2

$R^{B1}$ to $R^{B3}$ each independently represent a hydrogen atom or a monovalent group. $L^{B1}$ represents an n-valent linking group. $R^{B1}$ to $R^{B3}$ may be the same as or different from each other. n represents an integer of 2 to 6. m represents an integer of 1 to 6.

[9] The etching liquid according to any one of [1] to [8], in which the concentration of the phosphorus-containing compound is in the range of 0.0001% by mass to 5% by mass.

[10] The etching liquid according to any one of [1] to [9], in which the fluorine-containing compound is selected from a group consisting of hydrofluoric acid, ammonium fluoride, tetramethylammonium fluoride, tetrafluoroboric acid, hexafluorophosphoric acid, hexafluorosilicic acid, ammonium tetrafluoroborate, ammonium hexafluorophosphate, and ammonium hexafluorosilicate.

[11] The etching liquid according to any one of [1] to [10], in which the concentration of the nitric acid is in the range of 10% by mass to 95% by mass.

[12] The etching liquid according to any one of [1] to [11], in which the concentration of the fluorine-containing compound is in the range of 0.001% by mass to 10% by mass.

[13] The etching liquid according to any one of [1] to [12], in which a titanium-containing layer and a silicon-containing layer are both removable.

[14] The etching liquid according to [13], in which the ratio obtained by dividing the etching rate of the silicon-containing layer by the etching rate of the titanium-containing layer is adjusted to be in the range of 1000 to 0.1.

[15] The etching liquid according to [14], in which the ratio between the etching rates is adjusted by any one of the following means a to d or a combination of these, a: the ratio between the etching rates is increased by increasing the molecular weight of the nitrogen-containing organic compound;

b: the ratio between the etching rates is increased by increasing the concentration of the nitrogen-containing organic compound or the phosphorus-containing compound;

c: the etching rate of the titanium-containing layer and the etching rate of the silicon-containing layer are both increased by increasing the concentration of the fluorine-containing compound; and d: the etching rate of the titanium-containing layer and the etching rate of the silicon-containing layer are both increased by increasing the concentration of the nitric acid.

[16] A kit of an etching liquid which is a combination of a first liquid containing nitric acid and a second liquid containing a fluorine-containing compound and a nitrogen-containing organic compound A, which includes a plurality of repeating units containing a nitrogen atom, or a phosphorus-containing compound B.

[17] An etching method including: bringing the etching liquid according to any one of [1] to [15] into contact with the titanium-containing layer and the silicon-containing layer; and removing the titanium-containing layer and the silicon-containing layer.

[18] The etching method according to [17], in which the silicon-containing layer is a layer containing polycrystalline silicon or a layer containing amorphous silicon.

[19] The etching method according to [17] or [18], in which the titanium-containing layer is a layer containing titanium nitride.

[20] The etching method according to any one of [17] to [19], in which the ratio obtained by dividing the etching rate of the silicon-containing layer by the etching rate of the titanium-containing layer is adjusted to be in the range of 1000 to 0.1.

[21] The etching method according to [20], in which the ratio between the etching rates is adjusted by any one of the following means a to d or a combination of these,
   a: the ratio between the etching rates is increased by increasing the molecular weight of the nitrogen-containing organic compound;
   b: the ratio between the etching rates is increased by increasing the concentration of the nitrogen-containing organic compound or the phosphorus-containing compound;
   c: the etching rate of the titanium-containing layer and the etching rate of the silicon-containing layer are both increased by increasing the concentration of the fluorine-containing compound; and
   d: the etching rate of the titanium-containing layer and the etching rate of the silicon-containing layer are both increased by increasing the concentration of the nitric acid.

[22] A method for producing a semiconductor substrate product which is produced through a process of removing the titanium-containing layer and the silicon-containing layer using the etching method according to any one of [17] to [21].

[23] A method for manufacturing a semiconductor element which is manufactured through the method of producing a semiconductor substrate product according to [22].

According to the etching liquid, the kit of the same, the etching method using the same, the method for producing a semiconductor substrate product, and the method for manufacturing a semiconductor element of the present invention, it is possible to appropriately remove (preferably with high selectivity) a titanium-containing layer and a silicon-containing layer while suppressing surface roughness after etching. Further, it is possible to change the ratio (η) of the etching rate of the silicon-containing layer to the titanium-containing layer while appropriately controlling the ratio thereof without excessively decreasing the etching rate of the silicon-containing layer as needed.

The above-described features, other features, and advantages of the present invention will become more apparent from the following description and the accompanying drawings.

DESCRIPTION OF THE PREFERRED EMBODIMENTS

Figure 1:
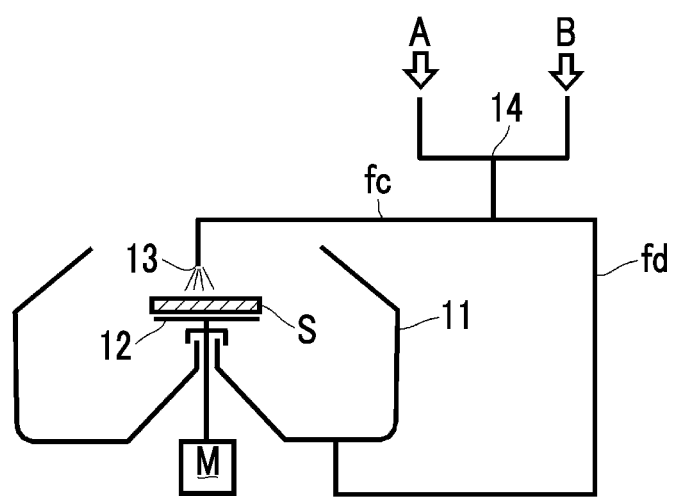
FIG. 1 is a device configuration view illustrating a part of an etching device according to a preferred embodiment of the present invention.

[Etching Liquid]
An etching liquid of the present invention contains nitric acid, a fluorine-containing compound, and specific additives (a nitrogen-containing organic compound A and a phosphorus-containing compound B). A preferred embodiment thereof will be described below.

(Nitric Acid)
The content of the nitric acid is preferably 10% by mass or greater, more preferably 20% by mass or greater, and particularly preferably 30% by mass or greater based on the total mass of the etching liquid of the present embodiment. The upper limit thereof is preferably 95% by mass or less, more preferably 90% by mass or less, still more preferably 80% by mass or less, and particularly preferably 70% by mass or less. The upper limit or less is substantially that preferred for obtaining a necessary dissolution rate of a silicon-containing layer by adjusting the range to be greater than or equal to the lower limit.

(Fluorine-Containing Compound)
The fluorine-containing compound of the present invention is not particularly limited as long as fluorine is included in a molecule, and a compound dissociating in water to release fluorine ions is preferable. Specific examples thereof include hydrofluoric acid, ammonium fluoride, tetramethylammonium fluoride, tetrafluoroboric acid, hexafluorophosphoric acid, hexafluorosilicic acid, ammonium tetrafluoroborate, ammonium hexafluorophosphate, and ammonium hexafluorosilicate. As a counter ion, a cation other than ammonium, for example, tetramethylammonium may be used.

The concentration of the fluorine-containing compound is preferably 0.001% by mass or greater, more preferably 0.01% by mass or greater, still more preferably 0.02% by mass or greater, and particularly preferably 0.03% by mass or greater based on the total mass of the etching liquid of the present embodiment. The upper limit thereof is preferably 10% by mass or less, more preferably 5% by mass or less, and still more preferably 2% by mass or less. The range being lower than or equal to the upper limit is preferable from a viewpoint of suppressing corrosion of other metals (for example, aluminum and an oxide thereof, copper, and a silicon oxide film) which are not intended to be dissolved. Further, it is preferable that the amount thereof is adjusted to be greater than or equal to the lower limit because then a necessary dissolution rate of the silicon-containing layer and the titanium-containing layer can be obtained.

Moreover, the fluorine-containing compound may be used alone or in combination of two or more kinds thereof.

(Specific Additives)
(Nitrogen-Containing Organic Compound A)
The nitrogen-containing organic compound includes a plurality of repeating units having nitrogen atoms. It is preferable that the repeating unit includes a primary amine structure (—NRx$_2$), a secondary amine structure (>NRx), a tertiary amine structure (>N—), or a quaternary ammonium structure (>N$^+$<) (these structures are collectively referred to as a "specific amine structure" and the repeating unit is referred to as a "specific amine repeating unit"). Rx represents a hydrogen atom or an alkyl group having 1 to 6 carbon atoms. It is preferable that the specific amine repeating unit defined here includes a linking group having the above-described specific amine structure and a carbon atom. For example, it is preferable that —NHCH$_2$— along with an imino group, having the primary amine structure, and a methylene group constitutes a specific amine repeating unit. Further, an amino acid residue is evaluated as one repeating unit and a plurality of specific amine repeating units are not included therein.

As the nitrogen-containing organic compound, a cationic surfactant including a hydrophilic nitrogen-containing group and a hydrophobic terminal group is exemplified. It is preferable that the nitrogen-containing organic compound includes a repeating unit having the specific amine structure. More specifically, it is preferable that the nitrogen-containing organic compound contains a repeating unit having a functional group selected from a group consisting of an amino group (—NRx₂), an amide group (—CONRx-), an imide group (—CONRxCO—), an imino group (—NRx-), an alkyleneimino group (—N(Rx)Lx-: Lx represents an alkylene group having 1 to 6 carbon atoms), a hydroxyalkyleneimino group ((—NRx)Ly-: Ly represents an alkylene group including a hydroxy group having 1 to 6 carbon atoms), an alkyleneammonium group (—NRx₂⁺Lx-), and a hydroxyalkyleneammonium group (—NRx₂⁺Ly-).

The number of specific amine repeating units existing in the nitrogen-containing organic compound is 40% or greater and more preferably 50% or greater of the total number of repeating units. The upper limit thereof is not particularly limited, but 100% or less of the total number of repeating units is preferable. The number of specific amine repeating units is preferably 2 to 1000 and more preferably 3 to 200 in a molecule.

The nitrogen-containing organic compound may be a homopolymer containing the above-described repeating unit or may be a copolymer. Alternatively, the nitrogen-containing polymer may further include another repeating unit (preferably a non-ionic repeating unit). Examples of another repeating unit include an ethylene oxide group, a propylene oxide group, or a repeating unit derived from styrene. The number of non-ionic repeating units existing in a polyelectrolyte is preferably 99% or less and more preferably 90% or less of the total number of repeating units. The lower limit thereof is not particularly limited, but may be 0% or greater from the viewpoint that the non-ionic repeating unit is an arbitrary repeating unit.

The nitrogen-containing organic compound may further include another repeating unit. Examples of another repeating unit include a repeating unit having a hydroxy group, a phosphonic acid group (or a salt thereof), a sulfonic acid group (or a salt thereof), a phosphoric acid group (or a salt thereof), or a carboxylic acid group (or a salt thereof).

The nitrogen-containing organic compound may be any of a homopolymer, a random copolymer, an alternating copolymer, a periodic copolymer, a block copolymer (for example, AB, ABA, or ABC), a graft copolymer, or a comb copolymer.

It is preferable that the specific amine repeating unit is selected from the following Formulae a-1 to a-8. It is preferable that two or more of the repeating units described below are included in a molecule and more preferable that three or more of the repeating units described below are included in a molecule.

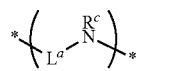
a-1

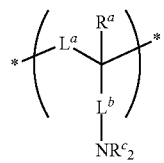
a-2

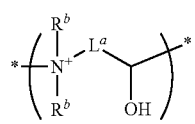
a-3

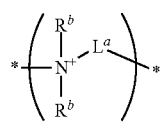
a-4

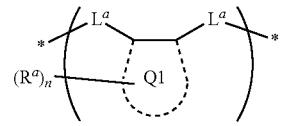
a-5

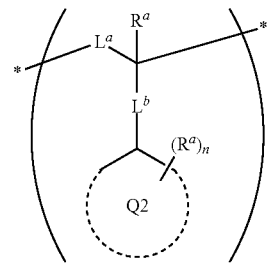
a-6

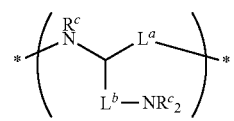
a-7

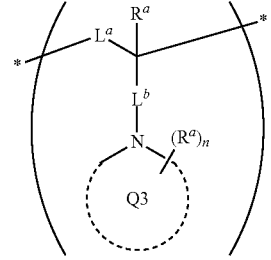
a-8

$R^a$ $R^a$ represents a hydrogen atom, an alkyl group (the number of carbon atoms is preferably 1 to 12, more preferably in the range of 1 to 6, and particularly preferably in the range of 1 to 3), an alkenyl group (the number of carbon atoms is preferably 2 to 12 and more preferably in the range of 2 to 6), an aryl group (the number of carbon atoms is preferably 6 to 22, more preferably in the range of 6 to 14, and particularly preferably in the range of 6 to 10), or a heterocyclic group (the number of carbon atoms is preferably 2 to 12 and more preferably in the range of 2 to 6). Among these, it is preferable that $R^a$ represents a hydrogen atom or a methyl group. In addition, an alkyl group in the present specification includes an aralkyl group.

$R^b$ $R^b$ represents an alkyl group (the number of carbon atoms is preferably 1 to 12, more preferably in the range of 1 to 6, and particularly preferably in the range of 1 to 3), an alkenyl group (the number of carbon atoms is preferably in the range of 2 to 12 and more preferably in the range of 2 to 6), or an aryl group (the number of carbon atoms is preferably in the range of 6 to 22, more preferably in the range of 6 to 14, and particularly preferably in the range of 6 to 10). Among these, it is preferable that $R^b$ represents a methyl group or an ethyl group.

$L^a$ $L^a$ represents an alkylene group (the number of carbon atoms is preferably in the range of 1 to 12, more preferably in the range of 1 to 6, and particularly preferably in the range of 1 to 3), a carbonyl group, an imino group (the number of carbon atoms is preferably in the range of 0 to 6 and more preferably in the range of 0 to 3), an arylene group (the number of carbon atoms is preferably in the range of 6 to 22, more preferably in the range of 6 to 14, and particularly preferably in the range of 6 to 10), a heterocyclic group (the number of carbon atoms is preferably in the range of 1 to 12 and more preferably in the range of 2 to 5), or a combination of these. Among these, an alkylene group or a carbonyl group is preferable, a methylene group, an ethylene group, a propylene group, or a carbonyl group is more preferable, a methylene group or an ethylene group is still more preferable, and a methylene group is particularly preferable.

$L^b$ $L^b$ represents a single bond, an alkylene group (the number of carbon atoms is preferably in the range of 1 to 12, more preferably in the range of 1 to 6, and particularly preferably in the range of 1 to 3), a carbonyl group, an imino group (the number of carbon atoms is preferably in the range of 0 to 6 and more preferably in the range of 0 to 3), an arylene group (the number of carbon atoms is preferably in the range of 6 to 22 and more preferably in the range of 6 to 14), a heterocyclic group (the number of carbon atoms is preferably in the range of 1 to 12 and more preferably in the range of 2 to 5), or a combination of these. Among these, a single bond, a methylene group, an ethylene group, a propylene group, or a carbonyl group is preferable and a single bond, a methylene group, or an ethylene group is more preferable.

$R^c$ $R^c$ represents a hydrogen atom or an alkyl group (the number of carbon atoms is preferably in the range of 1 to 12, more preferably in the range of 1 to 6, and particularly preferably in the range of 1 to 3). Among these, it is preferable that $R^c$ represents a hydrogen atom or a methyl group.

n n represents an integer of 0 or greater. The upper limit of n is the number of respective substitutable cyclic structural portions. For example, the number is 4 in a case of the following Formulae 5-1 to 5-4 and the number is 3 in a case of Formulae 6-5 and 6-6.

A ring Q1 represents a nitrogen-containing heterocycle, and a nitrogen-containing saturated heterocycle is preferable and a 5- or 6-membered ring nitrogen-containing saturated heterocycle is more preferable. Specifically, as the cyclic structure, the following Formulae 5-1 to 5-6 are preferable.

A ring Q2 represents a nitrogen-containing heterocycle, and a nitrogen-containing unsaturated heterocycle is preferable, a 5- or 6-membered ring nitrogen-containing unsaturated heterocycle is more preferable, and a pyrrolyl group, a pyrazolyl group, an imidazolyl group, a triazolyl group, a pyridyl group, or a pyrimidyl group (all of these, bonded at a C-position) is particularly preferable. Specifically, as the cyclic structure, the following Formulae 6-1 to 6-11 are preferable.

A ring Q3 represents a nitrogen-containing heterocycle, and a nitrogen-containing unsaturated heterocycle is preferable, a 5-membered ring nitrogen-containing unsaturated heterocycle is more preferable, and a pyrrolyl group, an imidazolyl group, a pyrazolyl group, or a triazolyl group (all of these, bonded at a N-position) is particularly preferable. Specifically, as the cyclic structure, the following Formulae 8-1 to 8-3 are preferable.

The symbol "*" in the formulae indicates a binding position.

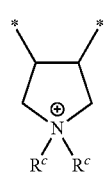

5-1

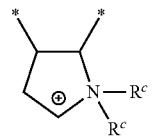

5-2

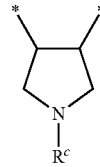

5-3

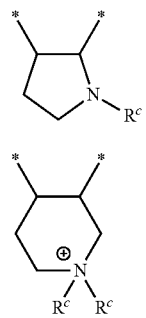

5-4

5-5

5-6

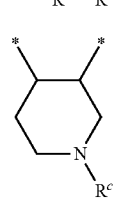

6-1

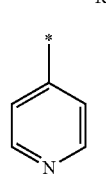

6-2

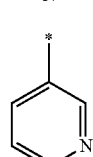

6-3

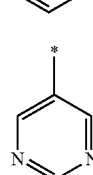

6-4

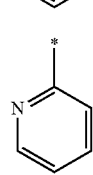

6-5

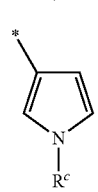

-continued 6-6
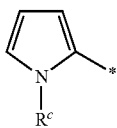

6-7
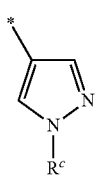

6-8
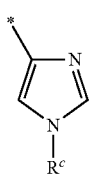

6-9
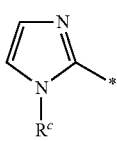

6-10
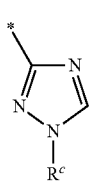

6-11
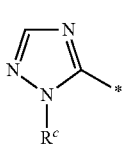

8-1
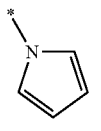

8-2
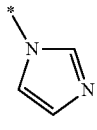

8-3
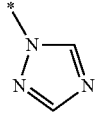

All of the above-described cyclic structural groups may be accompanied by a predetermined number of substituents Ra. In the formulae, an onium may become a salt. Further, in Formulae 6-1 to 6-11 and 8-1 to 8-3, the cyclic structural group may indicate an onium or a salt.

A plurality of $R^a$'s, $R^b$'s, $R^c$'s, $L^a$'s, and $L^b$'s are present in a molecule, and these may be the same as or different from each other. The plurality of $R^a$'s, $R^b$'s, and $R^c$'s may be bonded to each other to form a ring. Further, although not particularly noted, substituents or linking groups adjacent to each other may be bonded to each other to form a ring within a range not damaging the effects of the present invention.

Further, it is preferable that the nitrogen-containing organic compound is a compound represented by the following Formula b.

$$R^c_2N\text{-}[L^d\text{-}N(R^c)]_m\text{-}L^d\text{-}NR^c_2 \qquad b$$

In the formula, $R^c$ has the same definition as that described above. m represents an integer of 0 or greater, and is preferably 1 or greater, more preferably 2 or greater, and still more preferably 3 or greater. The upper limit, which is not particularly limited, is substantively 10 or less and more substantively 6 or less.

$L^d$ represents an alkylene group (the number of carbon atoms is preferably in the range of 1 to 12, more preferably in the range of 1 to 6, and particularly preferably in the range of 1 to 3), a carbonyl group, an imino group (the number of carbon atoms is preferably in the range of 0 to 6 and more preferably in the range of 0 to 3), an arylene group (the number of carbon atoms is preferably in the range of 6 to 22 and more preferably in the range of 6 to 14), a heterocyclic group (the number of carbon atoms is preferably in the range of 1 to 12 and more preferably in the range of 2 to 5), or a combination of these. Among these, an alkylene group is preferable, and a methylene group, an ethylene group, or a propylene group is more preferable.

Further, a plurality of $R^c$'s and $L^d$'s may be the same as or different from each other. The plurality of $R^c$'s and $L^d$'s may be bonded to each other to form a ring.

It is preferable that the nitrogen-containing organic compound is the following compounds. In this case, the present invention is not interpreted by being limited thereto.

A-1
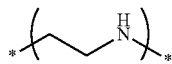

A-2
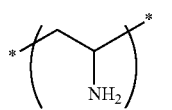

A-3
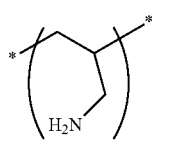

A-4
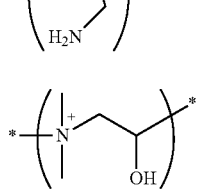

A-5
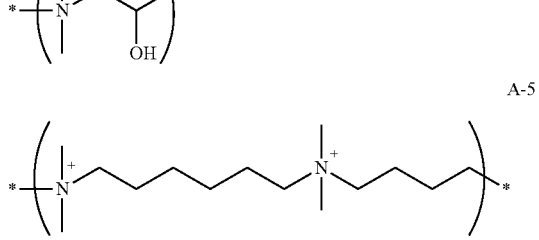

A-6
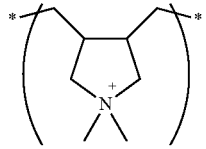

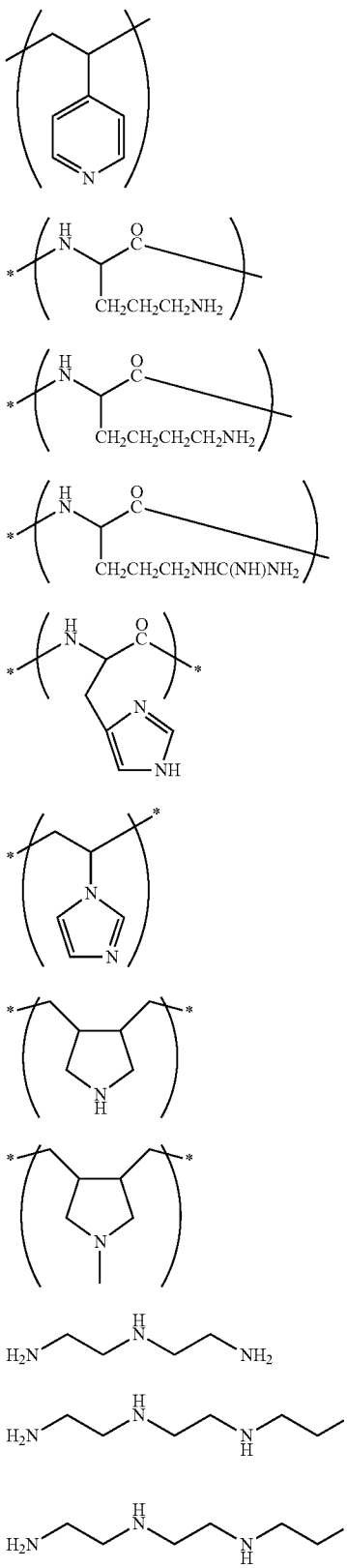

A-1: polyethylene imine
A-2: polyvinylamine
A-3: polyallylamine
A-4: dimethylamine-epihydrin-based polymer
A-5: polyhexadimethrine
A-6: polydimethyl diallyl ammonium (salt)
A-7: poly(4-vinylpyridine)
A-8: polyornithine
A-9: polylysine
A-10: polyarginine
A-11: polyhistidine
A-12: polyvinyl imidazole
A-13: polydiallylamine
A-14: polymethyl diallylamine
A-15: diethylenetriamine
A-16: triethylenetetramine
A-17: tetraethylenepentamine
A-18: pentaethylenehexamine (the chemical formula thereof is omitted)

Alternatively, it is preferable that the nitrogen-containing organic compound is a polyamino acid. A polyamino acid indicates a polyamide compound formed by an amino group of an amino acid and a carboxyl group being amino-bonded to each other and then polymerized. For example, the polyamide compound corresponds to a compound represented by any of Formulae A-8 to A-11 above.

The concentration of the nitrogen-containing organic compound in the etching liquid, which is not particularly limited, is preferably 0.0001% by mass or greater, more preferably 0.0005% by mass or greater, and particularly preferably 0.001% by mass or greater. The upper limit thereof is not particularly limited, but is preferably 5% by mass or less, more preferably 2% by mass or less, and particularly preferably 1% by mass or less. It is preferable that the concentration thereof is greater than or equal to the lower limit described above because the dissolution rate of a titanium-containing layer can be controlled. It is preferable that the concentration thereof is less than or equal to the upper limit described above from a viewpoint of capability of suppressing deposition of the nitrogen-containing organic compound. The nitrogen-containing organic compound may be used alone or in combination of two or more kinds thereof.

The nitrogen-containing organic compound is capable of appropriately suppressing dissolution of the titanium-containing layer which is excessively dissolved by the fluorine-containing compound. For this reason, by adjusting the content ratio of the fluorine-containing compound to the nitrogen-containing organic compound, a desired dissolution rate of the silicon-containing layer and the titanium-containing layer can be obtained. From this viewpoint, the content of the nitrogen-containing organic compound is preferably 0.01 parts by mass or greater, more preferably 0.05 parts by mass or greater, and particularly preferably 0.1 parts by mass or greater based on 100 parts by mass of the fluorine-containing compound. The content thereof is preferably 25 parts by mass or less, more preferably 5 parts by mass or less, and particularly preferably 1 part by mass or less.

Moreover, it is assumed that the nitrogen-containing organic compound achieves excellent selectivity while a protective film is formed on the titanium-containing layer using nitrogen as an adsorption point.

While the molecular weight thereof is not particularly limited, it is preferable that nitrogen-containing organic compounds are defined by being divided into high molecular-weight compounds and low-molecular-weight compounds. It is preferable that the compounds represented by Formulae a-1 to a-8 above are classified as high-molecular-weight compounds. It is preferable that the compound represented by Formula b above is classified as a low-molecular-weight compound. In the case of the compounds exemplified above, the compounds represented by Formulae A-1 to A-14 are high-molecular-weight compounds and the compounds represented by Formulae A-15 to A-18 are low-molecular-weight compounds.

In the case where the nitrogen-containing organic compound is a high-molecular-weight compound, the molecular weight thereof is preferably 100 or greater, more preferably 200 or greater, still more preferably 300 or greater, even still more preferably 500 or greater, even still more preferably 1000 or greater, and particularly preferably 2000 or greater. The upper limit thereof is preferably 100,000 or less, more preferably 50,000 or less, still more preferably 20,000 or less, and particularly preferably 10,000 or less. The ratio (η) between the etching rates can be effectively changed. The details will be described below.

In a case where the nitrogen-containing organic compound is a low-molecular-weight compound, the molecular weight thereof is preferably 50 or greater and more preferably 100 or greater. The upper limit thereof is preferably 1000 or less, more preferably 700 or less, still more preferably 500 or less, and particularly preferably 300 or less.

The molecular weight thereof is substantively greater than or equal to the lower limit described above. Meanwhile, from a viewpoint of capability of suppressing deposition of the nitrogen-containing organic compound, it is preferable that the molecular weight thereof is less than or equal to the upper limit described above. In the present invention, the ratio (q) of the etching rate can be effectively changed by changing the conditions of the molecular weight described above. The details will be described below.

The molecular weight of the nitrogen-containing organic compound is a value measured using the following method unless otherwise noted.

—Measuring Molecular Weight—

The molecular weight calculated from the chemical structure described in the catalog is applied to a commercially available compound. In a case where the chemical structure is unclear or the like, a method of performing column separation by LC-MS and then determining the molecular weight using mass spectrometry is used. In a case where mass spectrometry analysis is difficult to perform because the molecular weight is large, the weight average molecular weight in terms of polystyrene is measured by GPC. The weight average molecular weight is measured using a GPC device HLC-8220 (manufactured by TOSOH CORPORATION), THF (tetrahydrofuran, manufactured by Shonan Wako Junyaku) as an eluent, and G3000HXL+G2000HXL as a column. The flow rate at 23° C. is 1 mL/min and detection is by RI.

The nitrogen-containing organic compound may include an arbitrary substituent (for example, a substituent T described below) with respect to the above-described respective general formulae. However, it is preferable that the nitrogen-containing organic compound does not include an acidic group such as a carboxyl group.

(Phosphorus-Containing Compound B)

It is preferable that a phosphorus-containing compound is applied to the etching liquid of the present invention. It is preferable that the phosphorus-containing compound is a compound having a P=O bond and more preferable that the phosphorus-containing compound is a compound represented by the following Formula B1 or B2.

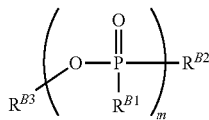

B1

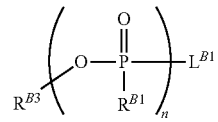

B2

$R^{B1}$ and $R^{B2}$ each independently represent a hydrogen atom or a monovalent group. As the monovalent group, a hydroxy group, an alkyl group (the number of carbon atoms is preferably in the range of 1 to 12, more preferably in the range of 1 to 6, and still more preferably in the range of 1 to 3, and a methyl group or an ethyl group is particularly preferable), an aralkyl group (the number of carbon atoms is preferably in the range of 7 to 21, more preferably in the range of 7 to 15, and still more preferably in the range of 7 to 11, and a benzyl group is particularly preferable), an alkoxy group (the number of carbon atoms is preferably in the range of 1 to 12, more preferably in the range of 1 to 6, and still more preferably in the range of 1 to 3, and a methoxy group or an ethoxy group is particularly preferable), an aryl group (the number of carbon atoms is preferably in the range of 6 to 20, more preferably in the range of 6 to 14, and still more preferably in the range of 6 to 10, and a phenyl group is particularly preferable), an aryloxy group (the number of carbon atoms is preferably in the range of 6 to 20, more preferably in the range of 6 to 14, and still more preferably in the range of 6 to 10, and a phenyloxy group is particularly preferable), or an aralkyloxy group (the number of carbon atoms is preferably in the range of 7 to 21, more preferably in the range of 7 to 15, and still more preferably in the range of 7 to 11, and a benzyloxy group is particularly preferable) is preferable. It is preferable that at least one of $R^{B1}$ and $R^{B2}$ represents a hydroxy group, an alkoxy group, an aralkyloxy group, or an aryloxy group. That is, it is preferable that a compound represented by Formula B1 is a phosphoric acid compound or a phosphonic acid compound. As a preferable example, one or both of $R^{B1}$ and $R^{B2}$ represent a hydroxy group. The alkyl group, the aralkyl group, the alkoxy group, the aryl group, the aryloxy group, and the aralkyloxy group may respectively include a substituent T.

$R^{B3}$ represents a hydrogen atom or a monovalent group. As the monovalent group, an alkyl group (the number of carbon atoms is preferably in the range of 1 to 12, more preferably in the range of 1 to 6, and still more preferably in the range of 1 to 3, and a methyl group or an ethyl group is particularly preferable), an aryl group (the number of carbon atoms is preferably in the range of 6 to 20, more preferably in the range of 6 to 14, and still more preferably in the range of 6 to 10, and a phenyl group is particularly preferable), or an aralkyl group (the number of carbon atoms is preferably in the range of 7 to 21, more preferably in the range of 7 to 15, and still more preferably in the range of 7 to 11, and a benzyl group is particularly preferable) is preferable. It is preferable that $R^{B3}$ represents a hydrogen atom. The alkyl group, the aryl group, and the aralkyl group may respectively include a substituent T.

$R^{B1}$ to $R^{B3}$ may be linked to each other to form a ring.

$L^{B1}$ represents an n-valent linking group. Examples of the linking group include an alkane linking group having 1 to 12 carbon atoms (preferably in the range of 1 to 6 and more preferably in the range of 1 to 3), an alkene linking group having 2 to 12 carbon atoms (preferably in the range of 2 to 6 and more preferably 2 or 3), an aryl linking group having 6 to 14 carbon atoms (preferably in the range of 6 to 10), $NR^M$, O, S, CO, and a combination of these. Here, it is preferable that $R^M$ represents a hydrogen atom, an alkyl group having 1 to 6 carbon atoms (preferably in the range of 1 to 3), an aryl group having 6 to 14 carbon atoms (preferably in the range of 6 to 10), or an atomic bond (linking group). In a case where $R^M$ represents an atomic bond (linking group), it is preferable that $R^M$ is bonded to a phosphorus-containing structural portion enclosed by parentheses of Formula (B2) through an alkylene group having 1 to 12 carbon atoms (preferably in the range of 1 to 6 and more preferably in the range of 1 to 3), an alkenylene group having 2 to 12 carbon atoms (preferably in the range of 2 to 6 and more preferably 2 or 3), or an arylene group having 6 to 14 carbon atoms (preferably in the range of 6 to 10).

n represents an integer of 2 to 6, and is preferably in the range of 2 to 4 and more preferably 2 or 3. m represents an integer of 1 to 10, and is preferably in the range of 1 to 8 and particularly preferably 1 to 6.

As the phosphorus-containing compound, phosphoric acid, phosphonic acid, polyphosphoric acid, phenylphosphonic acid, diphenyl phosphate, dodecylphosphoric acid, nitrilotris(methylenephosphonic acid), 1-hydroxyethane-1,1-bis(phosphonic acid), or benzylphosphonic acid is preferable.

The concentration of the phosphorus-containing compound in the etching liquid is preferably 0.0001% by mass or greater, more preferably 0.001% by mass or greater, and particularly preferably 0.01% by mass or greater. The upper limit thereof is preferably 5% by mass or less, more preferably 3% by mass or less, still more preferably 2% by mass or less, even still more preferably 1% by mass or less, even still more preferably 0.5% by mass or less, and particularly preferably 0.3% by mass or less. It is preferable that the ratio (η) of the etching rate described below is controlled in this range of the concentration of the phosphorus-containing compound.

It is assumed that the phosphorus-containing compound achieves the excellent selectivity by forming an adsorptive protection film on a titanium-containing layer so as to react with the outermost surface of the titanium-containing layer so that a hardly soluble film is formed. The phosphorus-containing compound may be used alone or in combination of two or more kinds thereof.

(Aqueous Medium)

Water may be used for the present invention. An aqueous medium containing dissolved components within a range not damaging the effects of the present invention may be used as water (aqueous medium) or water may contain a small amount of inevitable mixed in components. Among these, water subjected to a purification treatment such as distilled water, deionized water, or ultrapure water is preferable and ultrapure water used for manufacturing a semiconductor is particularly preferable.

(Other Components)

pH Regulator

In the present embodiment, a pH regulator may be used. It is preferable that tetramethylammonium, quaternary ammonium salts such as choline, alkali hydroxides such as potassium hydroxide, alkaline-earth salts, 2-aminoethanol, or an amino compound such as guanidine is used as the pH regulator for the purpose of increasing the pH value. Examples of the pH regulator used to decrease the pH value include inorganic acids such as hydrochloric acid, nitric acid, sulfuric acid, and phosphoric acid; and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid.

The amount of the pH regulator to be used is not particularly limited as long as an amount thereof required for adjusting the pH to be in the above-described range is used. The pH regulator may be used alone or in combination of two or more kinds thereof.

Water-Soluble Organic Solvent

A water-soluble organic solvent may be further added to the etching liquid of the present invention. As the water-soluble organic solvent, an organic solvent which can be mixed with water in an arbitrary ratio is preferable. It is effective to use such a solvent in terms that uniform etching properties in a plane of a wafer can be further improved.

Examples of the water-soluble organic solvent include an alcohol compound solvent such as methyl alcohol, ethyl alcohol, 1-propyl alcohol, 2-propyl alcohol, 2-butanol, ethylene glycol, propylene glycol, glycerin, 1,6-hexanediol, cyclohexanediol, sorbitol, xylitol, 2-methyl-2,4-pentanediol, 1,3-butanediol, or 1,4-butanediol; and an ether compound solvents including alkylene glycol alkyl ethers (ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, or diethylene glycol monobutyl ether).

Among these, an alcohol compound solvent containing 2 to 15 carbon atoms or a hydroxy group-containing ether compound solvent having 2 to 15 carbon atoms is preferable and an alcohol compound solvent which includes a plurality of hydroxy groups having 2 to 10 carbon atoms or a hydroxy group-containing ether compound solvent which includes a plurality of hydroxy groups having 2 to 10 carbon atoms is more preferable. An alkylene glycol alkyl ether having 3 to 8 carbon atoms is particularly preferable. A water-soluble organic solvent may be used alone or in combination of two or more kinds thereof. Further, in the present specification, a compound including a hydroxy group (—OH) and an ether group (—O—) in a molecule basically is included as an ether compound (the compound is not referred to as an alcohol compound). Further, when the compound including both of a hydroxy group and an ether group is intended to be distinguished from others, the compound is referred to as a hydroxy group-containing ether group in some cases.

Among these, propylene glycol or dipropylene glycol is particularly preferable. The amount of the solvent to be added is preferably in the range of 0.1% by mass to 70% by mass and more preferably in the range of 10% by mass to 50% by mass based on the total amount of the etching liquid. When the amount thereof is greater than or equal to the lower limit, the uniformity of the etching can be effectively improved.

It is preferable that the water-soluble organic solvent is a compound represented by the following Formula (O-1).

$$R^{11}-(-O-R^{13}-)_n-O-R^{12} \quad (O\text{-}1)$$

$R^{11}$ and $R^{12}$ $R^{11}$ and $R^{12}$ each independently represent a hydrogen atom or an alkyl group having 1 to 5 carbon atoms. Among these, it is preferable that $R^{11}$ and $R^{12}$ each independently represent an alkyl group having 1 to 5 carbon atoms and more preferable that $R^{11}$ and $R^{12}$ each independently represent an alkyl group having 1 to 3 carbon atoms.

$R^{13}$ $R^{13}$ represents a linear or branched alkylene chain having 1 to 4 carbon atoms. When a plurality of $R^{13}$'s are present, the plurality of $R^{13}$'s may be different from each other.

n n represents an integer of 1 to 6. When n represents an integer of 2 or greater, the plurality of $R^{13}$'s may be different from each other.

The water-soluble organic solvent may be used alone or in combination of two or more kinds thereof.

(Surfactant)

It is also preferable that the etching liquid of the present invention further contains a surfactant. This is effective for adjusting the etching rate of the silicon-containing layer to the titanium-containing layer in the same manner as in the above-described nitrogen-containing organic compound A or the phosphorus-containing compound B. Further, it is also effective for improving surface roughness of the silicon-containing layer. As a fluoroalkyl compound, a perfluoroalkyl compound is preferable. The number of carbon atoms is preferably in the range of 2 to 50, more preferably in the range of 2 to 20, and particularly preferably in the range of 2 to 10. As a surfactant, a fluorine-based surfactant including a perfluoroalkyl group in a molecule or a laurylamine-based surfactant is particularly preferable.

As the fluorine-based surfactant including a perfluoroalkyl group in a molecule, a perfluoroalkyl ethylene oxide adduct, a perfluoroalkylamine oxide, a perfluoroalkyl-containing oligomer, or a perfluoroalkyl betaine is preferable. Examples of the fluoroalkyl compound include the following.

SURFLON S-141 (non-ionic surfactant, perfluoroalkyl amine oxide)

SURFLON S-111N

SURFLON S-131 (amphoteric surfactant, perfluoroalkyl betaine)

All of the examples are perfluoroalkyl compounds (manufactured by AGC SEIMI CHEMICAL CO., LTD.).

It is preferable that the fluoroalkyl compound is represented by any one of the following Formulae S1 to S4. n represents an integer of 1 to 50, and is preferably an integer of 1 to 20 and more preferably an integer of 1 to 10. $R^S$ represents a single bond or an alkylene group having 1 to 6 carbon atoms.

$(CF_3(CF_2)_nR^SSO_3H)$      S1

$(CF_3(CF_2)_nR^SCOOH)$      S2

$(CF_3(CF_2)_nR^SNR^N{}_2{}^+O^-)$      S3

$(F(CF_2)_nR^SOH)$      S4

The preferred range of the application amount of the fluoroalkyl compound is the same as the range of the concentration of the above-described nitrogen-containing organic compound in the liquid. The ratio (η) of the etching rate described below can be controlled by adjusting the application amount of the fluoroalkyl compound and the same applies to the phosphorus-containing compound.

Further, examples of the laurylamine-based surfactant include the following.

AMIET 102 polyoxyethylene lauryl amine
AMIET 105 polyoxyethylene lauryl amine
AMIET 302 polyoxyethylene stearyl amine
AMIET 320 polyoxyethylene stearyl amine
All manufactured by Kao Corporation In the present invention, it is preferable to use the following surfactants.

Examples of the cationic surfactant include "SURFLON-121" (manufactured by AGC SEIMI CHEMICAL CO., LTD.), "FLUORAD FC-134" (manufactured by 3M Company), and "Megaface F-150" (manufactured by DIC Corporation).

Examples of the anionic surfactant include "SURFLON-111" and "SURFLON S-112" (manufactured by AGC SEIMI CHEMICAL CO., LTD.), "FLUORAD FC-143" (manufactured by 3M Company), and "Megaface F-120" (manufactured by DIC Corporation).

Examples of the amphoteric surfactant include "SURFLON-132" (manufactured by AGC SEIMI CHEMICAL CO., LTD.), "FLUORAD FX-172" (manufactured by 3M Company), and "Megaface F-120" (manufactured by DIC Corporation).

Examples of the non-ionic surfactant include "SURFLON-145" (manufactured by AGC SEIMI CHEMICAL CO., LTD.), "FLUORAD FC-170" (manufactured by 3M Company), and "Megaface F-141" (manufactured by DIC Corporation).

It is particularly preferable that the non-ionic surfactant is a fluorine-based surfactant including a perfluoroalkyl group in a molecule. Examples of the fluorine-based surfactant including a perfluoroalkyl group in a molecule include a perfluoroalkyl ethylene oxide adduct, a perfluoroalkylamine oxide, and a perfluoroalkyl-containing oligomer; and specific examples thereof include "SURFLON S-381", "SURFLON S-383", "SURFLON S-393", "SURFLON SC-101", "SURFLON SC-105", "SURFLON KH-40", and "SURFLON SA-100" (all manufactured by AGC SEIMI CHEMICAL CO., LTD.), and "Megaface F-171", "Megaface F-172", "Megaface F-173", "Megaface F-177", "Megaface F-178A", "Megaface F-178K", "Megaface F-179", "Megaface F-183", "Megaface F-184", "Megaface F-815", "Megaface F-470", and "Megaface F-471" (all manufactured by DIC Corporation).

Other examples of the surfactant include the following products.

(1) FLUORAD FC-170C (non-ionic surfactant, perfluoroalkyl polyoxyethylene ethanol) Sumitomo 3M Limited (2) Megaface F-1405 (non-ionic surfactant, perfluoroalkyl group-containing polyoxyethylene) DIC Corporation As another example of an anionic surfactant, a compound which includes a hydrophilic group and a lipophilic group in a molecule and in which the portion of the hydrophilic group thereof becomes an anion by dissociating in an aqueous solution or becomes anionic is exemplified. The number of carbon atoms of the anionic surfactant is preferably 3 or greater, more preferably 5 or greater, and particularly preferably 10 or greater. The upper limit thereof is not particularly limited, but the number of carbon atoms is substantively 20 or less.

Specific examples of the anionic surfactant include a carboxylic acid compound having 10 or greater carbon atoms, a phosphonic acid compound having 10 or greater carbon atoms, and a sulfonic acid compound having 10 or greater carbon atoms. Among these, preferred examples thereof include an alkyl sulfonic acid, an alkylbenzene sulfonic acid, an alkylnaphthalene sulfonic acid, an alkyldiphenyl ether sulfonic acid, a fatty acid amide sulfonic acid, a polyoxyethylene alkyl ether carboxylic acid, a polyoxyethylene alkyl ether acetic acid, a polyoxyethylene alkyl ether propionic acid, an alkyl phosphonic acid, a fatty acid, and salts of these.

Further, specific examples thereof include EMAL E-27C and NEOPELEX GS (both manufactured by KAO Corporation), W004, W005, and W017 (all manufactured by Yusho Co., Ltd.). Among these, an anionic surfactant formed of a sulfonic acid compound having 10 or greater carbon atoms is preferable, an alkyl sulfonic acid, an alkyl sulfonate, an alkylbenzene sulfonic acid, an alkylbenzene sulfonate, or an alkyl phosphonic acid is more preferable, and an alkyl sulfonic acid having 10 to 16 carbon atoms or an alkyl sulfonate is particularly preferable. Examples of "salts" include ammonium salts, sodium salts, potassium salts, and tetramethylammonium salts.

The concentration of other components is preferably 20% by mass or less, more preferably 10% by mass or less, and still more preferably 1% by mass or less based on the total amount of the etching liquid. The lower limit thereof is preferably 0.001% by mass or greater and particularly preferably 0.005% by mass or greater.

The surfactant may be used alone or in combination of two or more kinds thereof.

The showing of compounds in the present specification (for example, when a compound is referred to by being added at the end of the compound) is used to include the compound itself, a salt thereof, and an ion thereof. Further, the showing thereof includes derivatives in which there is a change due to introducing a substituent within a range in which desired effects can be exhibited.

A substituent (the same applies to a linking group) in which substitution or unsubstitution is not specified in the present specification means that an arbitrary substituent may be included in the group. The same applies to a compound in which substitution or unsubstitution is not specified. As a preferred substituent, the substituent T described below is exemplified.

Examples of the substituent T include the following.

An alkyl group (preferably an alkyl group having 1 to 20 carbon atoms such as methyl, ethyl, isopropyl, t-butyl, pentyl, heptyl, 1-ethylpentyl, benzyl, 2-ethoxyethyl, or 1-carboxymethyl), an alkenyl group (preferably, an alkenyl group having 2 to 20 carbon atoms such as vinyl, allyl, or oleyl), an alkynyl group (preferably an alkynyl group having 2 to 20 carbon atoms such as ethynyl, butadiynyl, or phenylethynyl), a cycloalkyl group (preferably a cycloalkyl group having 3 to 20 carbon atoms such as cyclopropyl, cyclopentyl, cyclohexyl, or 4-methylcyclohexyl), an aryl group (preferably an aryl group having 6 to 26 carbon atoms such as phenyl, 1-naphthyl, 4-methoxyphenyl, 2-chlorophenyl, or 3-methylphenyl), a heterocyclic group (preferably a heterocyclic group having 2 to 20 carbon atoms or preferably a 5- or 6-membered heterocyclic ring having at least one of an oxygen atom, a sulfur atom and a nitrogen atom such as 2-pyridyl, 4-pyridyl, 2-imidazolyl, 2-benzimidazolyl, 2-thiazolyl, or 2-oxazolyl), an alkoxy group (preferably an alkoxy group having 1 to 20 carbon atoms such as methoxy, ethoxy, isopropyloxy, or benzyloxy), an aryloxy group (preferably an aryloxy group having 6 to 26 carbon atoms such as phenoxy, 1-naphthyloxy, 3-methylphenoxy, or 4-methoxyphenoxy), an alkoxycarbonyl group (preferably an alkoxycarbonyl group having 2 to 20 carbon atoms such as ethoxycarbonyl or 2-ethylhexyloxycarbonyl), an amino group (preferably an amino group having 0 to 20 carbon atoms, an alkylamino group having 0 to 20 carbon atoms, or an arylamino group having 0 to 20 carbon atoms such as amino, N,N-dimethylamino, N,N-diethylamino, N-ethylamino, or anilino), a sulfamoyl group (preferably a sulfamoyl group having 0 to 20 carbon atoms such as N,N-dimethylsulfamoyl or N-phenylsulfamoyl), an acyl group (preferably an acyl group having 1 to 20 carbon atoms such as acetyl, propionyl, butyryl, or benzoyl), an acyloxy group (preferably an acyloxy group having 1 to 20 carbon atoms such as acetyloxy or benzoyloxy), a carbamoyl group (preferably a carbamoyl group having 1 to 20 carbon atoms such as N,N-dimethylcarbamoyl or N-phenylcarbamoyl), an acylamino group (preferably an acylamino group having 1 to 20 carbon atoms such as acetylamino or benzoylamino), a sulfonamide group (preferably a sulfonamide group having 0 to 20 carbon atoms such as methanesulfonamide, benzenesulfonamide, N-methylmethanesulfonamide, or N-ethylbenzenesulfonamide), an alkylthio group (preferably an alkylthio group having 1 to 20 carbon atoms such as methylthio, ethylthio, isopropylthio, or benzylthio), an arylthio group (preferably an arylthio group having 6 to 26 carbon atoms such as phenylthio, 1-naphthylthio, 3-methylphenylthio, or 4-methoxyphenylthio), an alkyl or arylsulfonyl group (preferably an alkyl or arylsulfonyl group having 1 to 20 carbon atoms such as methylsulfonyl, ethylsulfonyl, or benzenesulfonyl), and a hydroxyl group, a cyano group, and a halogen atom (such as a fluorine atom, a chlorine atom, a bromine atom, or an iodine atom). Among these, an alkyl group, an alkenyl group, an aryl group, a heterocyclic group, an alkoxy group, an aryloxy group, an alkoxycarbonyl group, an amino group, an acylamino group, a hydroxyl group or a halogen atom is more preferable. Further, an alkyl group, an alkenyl group, a heterocyclic group, an alkoxy group, an alkoxycarbonyl group, an amino group, an acylamino group, or a hydroxyl group is particularly preferable.

Moreover, respective groups exemplified in these substituents T may be further substituted with the above-described substituents T.

(Kit)

The etching liquid in the present invention may be used for a kit obtained by dividing the raw materials of the etching liquid into plural parts. For example, an aspect in which a liquid composition containing the above-described nitric acid in an aqueous medium as a first liquid is prepared and a liquid composition containing the above-described fluorine-containing compound and specific additives (a nitrogen-containing organic compound A and a phosphorus-containing compound B) in an aqueous medium as a second liquid is prepared is exemplified. As a usage example, an aspect of preparing an etching liquid by mixing both of the liquids and then using the etching liquid for the etching treatment at a suitable time is preferable. In this manner, deterioration of liquid performance due to decomposition of respective components is not caused and a desired etching action can be effectively exhibited. Here, the term "suitable time" after mixing both of the liquids indicates a period after which a desired action is lost after mixing, and, specifically, the period is preferably within 60 minutes, more preferably within 30 minutes, and particularly preferably within 10 minutes. The lower limit thereof, which is not particularly limited, is substantively 1 second or longer.

It is preferable that the concentration of the nitric acid in the first liquid and the concentration of the fluorine-containing compound and the concentration of the fluorine-containing compound and the specific additives in the second liquid are set to be in the preferred range of the concentration of the etching liquid after mixing.

The manner of mixing the first liquid and the second liquid is not particularly limited, but the mixing is preferably performed by circulating the first liquid and the second liquid in different channels and merging both of the liquids at a junction point. Subsequently, it is preferable that both of the liquids are circulated through the channels, an etching liquid obtained after both of the liquids are merged is ejected or sprayed from an ejection opening, and the etching liquid is brought into contact with a semiconductor substrate. In the embodiment, it is preferable that the process from when both of the liquids are merged and mixed with each other at the junction point to when the solution is brought into contact with the semiconductor substrate is performed at the "suitable time". When this process is described with reference to FIG. 1, the prepared etching liquid is sprayed from an ejection opening 13 and then applied to the upper surface of a semiconductor substrate S in a reaction container 11. In the embodiment shown in the same figure, two liquids A and 13 are supplied to be merged with each other at a junction point 14 and then the liquids are moved to the ejection opening 13 through a channel fc. A channel fd indicates a returning path for reusing a liquid chemical. It is preferable that the semiconductor substrate S is on a rotary table 12 and is rotated along with the rotary table by a rotation driving unit M. In addition, in the embodiment in which such a substrate rotation type device is used, the same applies to a treatment using the etching liquid which is not used for a kit.

(Container)

The etching liquid of the present invention is stored by being filled into an arbitrary container, is transported, and then used in consideration of corrosion resistance or the like (regardless of the container being a kit or not). Further, a container whose cleanliness is high and in which impurities are not largely eluted is preferable in the application of using the container for semiconductors. As a usable container, "Clean bottle" series (manufactured by AICELLO CORPORATION) or "Pure bottle" (manufactured by KODAMA PLASTICS Co., Ltd.) is exemplified, but the examples are not limited thereto.

[Etching Conditions]

In the present embodiment, the conditions for performing etching are not particularly limited, and sheet type etching or immersion type etching may be performed. In the sheet type etching, the semiconductor substrate is transported or rotated in a predetermined direction, the etching liquid is provided (spraying, dripping, downward flowing or the like) to a space, and the etching liquid is brought into contact with the semiconductor substrate. Meanwhile, in batch type etching, the semiconductor substrate is immersed in a liquid bath formed of the etching liquid and the etching liquid is brought into contact with the semiconductor substrate in the liquid bath. These etching systems are appropriately and selectively used depending on the structure or materials of an element.

The temperature at which etching is performed in the method of measuring the temperature shown in examples described below is preferably 15° C. or higher and particularly preferably 20° C. or higher. The upper limit thereof is preferably 80° C. or lower and more preferably 60° C. or lower. It is preferable that the temperature is set to be higher than or equal to the lower limit because a preferable ratio of the etching rate of the silicon-containing layer to that of a Ti-containing layer can be secured. It is preferable that the temperature thereof is set to be lower than or equal to the upper limit thereof because stability over time for the rate of the etching treatment can be maintained and the in-plane uniformity at the time when the treatment is carried out using a sheet type device can be improved. The rate of supplying the etching liquid, which is not particularly limited, is preferably in the range of 0.05 L/min to 10 L/min and more preferably in the range of 0.1 L/min to 5 L/min. It is preferable that the rate thereof is set to be greater than or equal to the lower limit because the in-plane uniformity of etching can be more excellently secured. It is preferable that the rate thereof is set to be less than or equal to the upper limit because selectivity stabilized at the time of continuously performing a treatment can be secured. The rotation of the semiconductor substrate also depends on the size thereof and the semiconductor substrate rotates preferably at 50 rpm to 500 rpm from the same viewpoint described above.

In the case of batch type etching, for the same reason described above, it is preferable that the temperature of the liquid bath is set to be in the above-described range. The time of immersing the semiconductor substrate, which is not particularly limited, is preferably in the range of 0.5 minutes to 30 minutes and more preferably in the range of 1 minute to 10 minutes. It is preferable that the time thereof is set to be longer than or equal to the lower limit because the in-plane uniformity of etching can be secured. It is preferable that the time thereof is set to be shorter than or equal to the upper limit because performance in a case of using the etching liquid again can be maintained.

In sheet type etching according to the preferred embodiment of the present invention, it is preferable that the semiconductor substrate is transported or rotated in a predetermined direction and an etching liquid is brought into contact with the semiconductor substrate by spraying the etching liquid to the space in the semiconductor substrate. The rate of supplying the etching liquid and the rotation rate of the substrate are the same as those described above.

Figure 2:
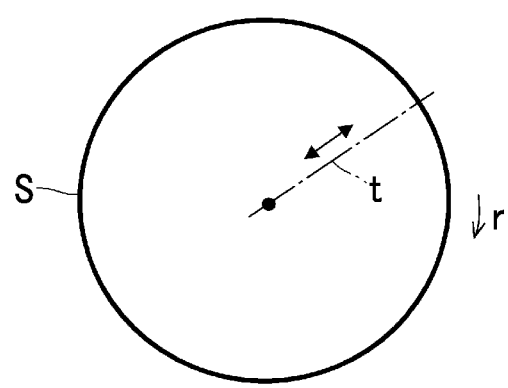
FIG. 2 is a plan view schematically illustrating a movement locus line of a nozzle with respect to a substrate according to an embodiment of the present invention.

In the configuration of the sheet type device according to the preferred embodiment of the present invention, it is preferable that the etching liquid is provided while the ejection opening (nozzle) is moved as illustrated in FIG. 2. Specifically, in the present embodiment, the substrate is rotated in an r direction when the etching liquid is applied to the semiconductor substrate S. Further, the ejection opening is set to move along a movement locus line t extending to the end portion from the central portion of the semiconductor substrate. In this manner, the rotation direction of the substrate and the movement direction of the ejection opening are set to be different from each other in the present embodiment and thus both directions are set to move relative to each other. As the result, the etching liquid can be evenly provided over the entire surface of the semiconductor substrate and the uniformity of etching is suitably secured.

The moving speed of the ejection opening (nozzle), which is not particularly limited, is preferably 0.1 cm/s or greater and more preferably 1 cm/s or greater. The upper limit thereof is preferably 30 cm/s or less and more preferably 15 cm/s or less. The movement locus line may be linear or curved (for example, arc-shaped). In both cases, the movement speed can be calculated from the distance of an actual locus line and the time spent for the movement thereof

[Residue]

In the manufacturing process of the semiconductor element, a process of performing etching on a metal layer or the like of the semiconductor substrate through plasma etching which uses a resist pattern or the like as a mask may be included. Specifically, a metal layer, a semiconductor layer, an insulating layer, or the like is etched, the metal layer or the semiconductor layer is patterned, or an opening such as a via hole or a wiring groove is formed on the insulating layer. In plasma etching, a residue derived from the resist used as a mask, the metal layer to be etched, the semiconductor layer, or the insulating layer may be formed on the semiconductor substrate. In the present invention, the residue generated by such plasma etching is referred to as a "plasma etching residue".

Further, the resist pattern used as a mask is removed after etching. For removal of the resist pattern, a wet method which uses a stripper solution or a dry method which is carried out through ashing using plasma, ozone, and the like is used. In the ashing, a residue resulting from modification of the plasma etching residue generated by plasma etching or a residue derived from the resist to be removed is generated on the semiconductor substrate. In the present invention, a residue generated by such ashing is referred to as an "ashing residue". Further, the plasma etching residue and the ashing residue which are generated on the semiconductor substrate and need to be washed away and removed are collectively and simply referred to as a "residue" in some cases.

It is preferable that the plasma etching residue or the ashing residue which is a residue after etching (post etch residue) is removed by washing with a clearing composition. The etching liquid of the present embodiment can be applied as a cleaning liquid for removing the plasma etching residue and/or the ashing residue. Among these, it is preferable that the etching liquid is used to remove the plasma etching residue and the ashing residue after plasma ashing which is performed subsequent to plasma etching.

[Workpiece]

Ti-Containing Layer

A layer (preferably a layer containing TiN) containing Ti can be etched using the etching liquid of the present invention. Here, a layer containing TiN (referred to as a TiN layer) may contain oxygen. Further, particularly, when the layer is intended to be distinguished from a layer which does not contain oxygen, the layer is referred to as a TiON layer in some cases. In the present invention, the oxygen content of the surface of the TiN layer is preferably 10% by mole or less, more preferably 8.5% by mole or less, still more preferably 6.5% by mole or less, and particularly preferably 1% by mole or less. The lower limit thereof is preferably 0.001% by mole or greater, more preferably 0.005% by mole or greater, and still more preferably 0.01% by mole or greater. Adjustment of the oxygen concentration in the TiN layer due to the substrate can be performed, for example, by adjusting the oxygen concentration in a process chamber of chemical vapor deposition (CVD) at the time when the TiN layer is formed. The above-described oxygen concentration can be specified using a method employed in examples described below. Further, preferably, the Ti-containing layer contains Ti as a main component and TiN as well, but may contain other components within a range in which the effects of the present invention are exhibited. The same applies to other layers such as other metal layers or the like.

The thickness of the Ti-containing layer is not particularly limited, but is substantively in the range of approximately 0.005 μm to 0.3 μm when the configuration of a normal element is considered. An etching rate [ER1] of the Ti-containing layer is not particularly limited, but is preferably 0.1 Å/min or greater, more preferably 1 Å/min or greater, and particularly preferably 5 Å/min or greater in consideration of production efficiency. The upper limit is not particularly limited, but is substantively 500 Å/min or less.

Silicon-Containing Layer

In the present invention, the silicon-containing layer can be etched using the etching liquid and, preferably, polycrystalline silicon or amorphous silicon is etched.

Examples of silicon materials generally include monocrystalline silicon, polycrystalline silicon (polysilicon), and amorphous silicon (noncrystalline silicon).

The monocrystalline silicon indicates silicon crystals in which the orientation of atomic arrangement is uniform throughout the whole crystals, but various defects are present when the crystals are practically observed at an atomic level.

The polycrystalline silicon indicates block or layered silicon formed of multiple single crystal grains whose orientations of crystals are different from each other. The polycrystalline silicon may include silicon formed with only Si or silicon doped with boron or phosphorus. In addition, silicon with various defects or impurities similar to that described above may be included within a range in which desired effects are exhibited. The production method is not particularly limited, and silicon formed by a CVD method is exemplified.

The amorphous silicon indicates an amorphous semiconductor whose constituent element is silicon from among amorphous semiconductors. Specifically, as described below, the amorphous silicon indicates silicon which does not have a long-distance periodic structure. The silicon does not include silicon in which atomic arrangements are disorderly bonded to each other but includes silicon in which any kind of the arrangement order is locally maintained. Due to the disordered bonding, silicon atoms lose bonding counterparts of covalent bonds and thus dangling bonds occupied by electrons which are not involved in bonding exist. A dangling bond in which hydrogen is bonded (hydrogenated) is referred to as hydrogenated amorphous silicon and has a stable solid form. In the present specification, the silicon is simply noted as amorphous silicon, but indicates both of amorphous silicon which is not hydrogenated and amorphous silicon which is hydrogenated.

In the present invention, as described above, it is preferable that the polycrystalline silicon or amorphous silicon is the target to be etched. Here, the meaning thereof will be described. First, the monocrystalline silicon has surface selectivity and the etching rate in a specific surface is high. Meanwhile, the etching rate in a surface other than the specific surface is extremely low or the surface is not etched. The etching rate in the polycrystalline silicon or the amorphous silicon does not have such surface selectivity, but the etching rate thereof tends to be low compared to the etching rate of the monocrystalline silicon, which is high, in the specific surface. A polycrystalline silicon film or an amorphous silicon film can be etched by the silicon etching liquid of the present invention with a high speed using an etching mechanism which is different from that of the monocrystalline silicon and etching in which selectivity with respect to TiN or the like is controlled can be achieved, which is preferable.

The thickness of the silicon-containing layer is not particularly limited, but is substantively in the range of 0.005 μm to 3 μm when the configuration of a normal element is considered. An etching rate [ER2] of the silicon-containing layer is not particularly limited, but is preferably 10 Å/min or greater, more preferably 100 Å/min or greater, and particularly preferably 200 Å/min or greater in consideration of production efficiency. The upper limit is not particularly limited, but is substantively 10,000 Å/min or less.

Ratio (η) of Etching Rate

The ratio (η=SiER/TiER) of the etching rate of the silicon-containing layer [SiER] to the etching rate of the Ti-containing layer [TiER] is not particularly limited, but, in the present invention, it is preferable that the ratio thereof is appropriately adjusted under control. In the preferred embodiment, the ratio (η) of the etching rate is adjusted to be preferably in the range of 0.1 to 1000, more preferably in the range of 0.5 to 500, and particularly preferably 1 to 200. It is preferable to provide a liquid chemical providing a desired ratio (η) of the etching rate within the above-described range at a desired timing at a desired amount because of adaptability to various processed forms or a change in a specification. For example, in the case of the above-described sheet type device (FIG. 1), a liquid chemical providing a desired ratio between the etching rates can be formulated and is compatible with various processed forms or a change in a specification without the device being stopped by appropriately changing the ratio between two liquids to be supplied or changing a supply source (liquid chemical). Alternatively, it is possible to realize a high degree of quality control by feeding back information related to a state of a processed product and finely adjusting the formulation of a liquid chemical while the state of the processed product is observed.

It is preferable that the ratio (η) of the etching rate is adjusted by any appropriate one of the following means a to d or a combination of these.

(a: the ratio (η) of the etching rate is increased by increasing the molecular weight of the nitrogen-containing organic compound)

(b: the ratio (η) of the etching rate is increased by increasing the concentration of the nitrogen-containing organic compound A or the phosphorus-containing compound B)

(c: TiER and SiER are both increased by increasing the concentration of the fluorine-containing compound)

(d: TiER and SiER are both increased by increasing the concentration of the nitric acid)

Here, as an advantage other than the control of the ratio between the etching rates in the present invention, the surface roughness after a treatment can be reduced by means of using the etching liquid of the present invention. When the surface roughness after a treatment is reduced, this leads to a reduction in surface roughness of a metal film to be laminated or an insulating film and then defects such as a pinhole in a final device can be prevented.

[Production of Semiconductor Substrate Product and Manufacture of Semiconductor Element]

In the present embodiment, it is preferable that a semiconductor substrate product and a semiconductor element which have a desired structure are manufactured by performing a process of preparing a semiconductor substrate on which the Ti-containing layer and the silicon-containing layer are formed, on a silicon wafer, and a process of applying the etching liquid to the semiconductor substrate and removing the Ti-containing layer and the silicon-containing layer with desired selectivity. At this time, it is preferable that the above-described specific etching liquid is used for etching.

EXAMPLES

Hereinafter, the present invention will be specifically described with reference to Examples, but the present invention is not limited to Examples described below. Further, % and parts shown in a formulation or in a concentration are on a mass basis unless otherwise noted.

Example 1 and Comparative Example 1

An etching liquid was prepared by including the components listed in the following Table 1 at a composition (% by mass) listed in the same table. The following respective tests were performed within 1 minute after the preparation of the etching liquid. Further, the remainder was water (pure water). The etching liquid was supplied by sending a first liquid containing nitric acid and a second liquid containing a fluorine-containing compound and a nitrogen-containing organic compound A or a phosphorus-containing compound B to devices A and B in FIG. 1 (see the details below). The temperature of the etching was room temperature (25° C.).

(Preparation of Substrate)

A TiN layer (thickness: 0.05 μm) having a surface oxygen concentration of less than 0.1% by mole was prepared by chemical vapor deposition (CVD) on a commercially available silicon substrate. In addition, a layer (thickness: 0.3 μm) of amorphous silicon was formed by CVD similarly, thereby obtaining a substrate for a test.

(Surface Oxygen Concentration of Substrate)

The surface oxygen concentration of the TiN layer was obtained by measuring concentration profiles of Ti, O, and N in the range of 0 nm to 30 nm in the depth direction using etching ESCA (Quantera, manufactured by ULVAC-PHI, Inc.), respectively calculating the contents thereof in the range of 5 nm to 10 nm, acquiring the average oxygen content, and setting the average value as the surface oxygen concentration.

(Etching Test)

The etching was performed under the following conditions in a sheet type device (POLOS (trade name), manufactured by SPS-Europe B. V.) with respect to the substrate for a test and an evaluation test was carried out.

Treatment temperature: 25° C.
Ejection amount: 1 L/min.
Wafer rotation speed: 500 rpm (Method of Measuring Treatment Temperature)

A radiation thermometer IT-550F (trade name, manufactured by HORIBA, Ltd.) was fixed to a position having a height of 30 cm on a wafer in the sheet type device. The thermometer was directed to the surface of the wafer outside from the center thereof distanced by 2 cm and the temperature was measured while circulating a liquid chemical. The temperature was continuously recorded using a computer through digital output from the radiation thermometer. From this, a value obtained by averaging the recorded values of the temperature for 10 seconds at the time when the temperature thereof was stabilized was set as a temperature on the wafer.

(Etching Rate)

The etching rate (a-SiER, TiNER) was calculated by measuring the film thickness before or after the etching treatment using Ellipsometry (VASE [trade name], Spectroscopic ellipsometer, J. A. Woollam Co., Inc.). The average value of five points was adopted (measurement conditions: measurement range: 1.2 eV to 2.5 eV, measuring angles: 70 degrees and 75 degrees).

(Surface Roughness [Ra])

The surface roughness of the silicon-containing layer was measured using AFM (Nanoscope IV manufactured by Veeco Instruments Inc.) under the following conditions. A smaller surface roughness thereof is preferable.

Measurement area: 1.0 μm square
Scan rate: 1 Hz

TABLE 1

| No. | Concentration of nitric acid | Fluorine-containing compound | Nitrogen-containing organic compound | Water | a-SiER (Å/min) | TiNER (Å/min) | η | Ra (nm) |
|---|---|---|---|---|---|---|---|---|
| 101 | 60 | F1 (0.07) | PEI Mw. 300 (0.01) | Remainder | 479 | 30 | 16 | 0.11 |
| 102 | 60 | F1 (0.07) | PEI Mw. 1000 (0.01) | Remainder | 514 | 19 | 27 | 0.10 |
| 103 | 60 | F1 (0.07) | PEI Mw. 5000 (0.01) | Remainder | 497 | 6 | 83 | 0.10 |
| 104 | 60 | F1 (0.07) | PVAm Mw. 1000 (0.01) | Remainder | 518 | 30 | 17 | 0.01 |
| 105 | 60 | F1 (0.07) | PVAm Mw. 3000 (0.01) | Remainder | 516 | 26 | 20 | 0.05 |
| 106 | 60 | F1 (0.07) | PVAm Mw. 8000 (0.01) | Remainder | 506 | 10 | 51 | 0.12 |
| 107 | 60 | F2 (0.05) | PEI Mw. 2000 (0.001) | Remainder | 124 | 5 | 25 | 0.03 |
| 108 | 60 | F2 (0.05) | PEI Mw. 2000 (0.5) | Remainder | 111 | 3 | 37 | 0.16 |
| 109 | 60 | F2 (0.1) | PEI Mw. 2000 (0.001) | Remainder | 309 | 17 | 18 | 0.05 |
| 110 | 60 | F2 (0.1) | PEI Mw. 2000 (0.5) | Remainder | 281 | 5 | 56 | 0.18 |
| 111 | 60 | F2 (0.2) | PEI Mw. 2000 (0.001) | Remainder | 796 | 51 | 16 | 0.06 |
| 112 | 60 | F2 (0.2) | PEI Mw. 2000 (0.5) | Remainder | 823 | 21 | 39 | 0.03 |
| 113 | 60 | F2 (0.5) | PEI Mw. 2000 (0.001) | Remainder | 2992 | 181 | 17 | 0.04 |
| 114 | 60 | F2 (0.5) | PEI Mw. 2000 (0.5) | Remainder | 2982 | 38 | 78 | 0.09 |
| 115 | 60 | F1 (0.02) | PAAm Mw. 3000 (0.001) | Remainder | 86 | 5 | 17 | 0.14 |
| 116 | 60 | F1 (0.02) | PAAm Mw. 3000 (0.5) | Remainder | 91 | 3 | 30 | 0.17 |
| 117 | 60 | F1 (0.05) | PAAm Mw. 3000 (0.001) | Remainder | 309 | 15 | 21 | 0.06 |
| 118 | 60 | F1 (0.05) | PAAm Mw. 3000 (0.5) | Remainder | 282 | 5 | 56 | 0.06 |
| 119 | 60 | F1 (0.1) | PAAm Mw. 3000 (0.001) | Remainder | 819 | 50 | 16 | 0.07 |
| 120 | 60 | F1 (0.1) | PAAm Mw. 3000 (0.5) | Remainder | 803 | 19 | 42 | 0.11 |
| 121 | 65 | F1 (0.1) | PEI Mw. 1500 (0.01) | Remainder | 1007 | 51 | 20 | 0.08 |
| 122 | 60 | F1 (0.1) | PEI Mw. 1500 (0.01) | Remainder | 783 | 41 | 19 | 0.19 |
| 123 | 50 | F1 (0.1) | PEI Mw. 1500 (0.01) | Remainder | 584 | 20 | 29 | 0.05 |
| 124 | 40 | F1 (0.1) | PEI Mw. 1500 (0.01) | Remainder | 280 | 10 | 28 | 0.13 |
| 125 | 60 | F1 (0.07) | Polyhexadimethrine Mw. 6000 (0.03) | Remainder | 524 | 31 | 17 | 0.08 |
| 126 | 60 | F1 (0.07) | Poly(4-vinylpyridine) Mw. 2000 (0.5) | Remainder | 503 | 26 | 19 | 0.17 |
| 127 | 60 | F1 (0.07) | PVI Mw. 600 (0.3) | Remainder | 512 | 25 | 20 | 0.12 |
| 128 | 60 | F1 (0.07) | PVAm Mw. 5000 (0.05) | Remainder | 488 | 30 | 16 | 0.01 |
| 129 | 60 | F1 (0.07) | Polyhistidine Mw. 5000 (0.03) | Remainder | 524 | 20 | 26 | 0.10 |

TABLE 1-continued

| No. | Concentration of nitric acid | Fluorine-containing compound | Nitrogen-containing organic compound | Water | a-SiER (Å/min) | TiNER (Å/min) | η | Ra (nm) |
|---|---|---|---|---|---|---|---|---|
| 130 | 60 | F1 (0.07) | PAAm Mw. 3000 (0.05) | Remainder | 507 | 29 | 17 | 0.07 |
| 131 | 60 | F1 (0.07) | Polyarginine Mw. 7000 (0.4) | Remainder | 481 | 27 | 18 | 0.15 |
| 132 | 60 | F1 (0.07) | PDMA Mw. 1000 (0.06) | Remainder | 513 | 10 | 51 | 0.02 |
| 133 | 60 | F1 (0.07) | Polylysine Mw. 4000 (0.05) | Remainder | 488 | 16 | 31 | 0.15 |
| 134 | 60 | F1 (0.07) | Polyornithine Mw. 2000 (0.5) | Remainder | 515 | 9 | 57 | 0.18 |
| 135 | 60 | F1 (0.07) | Diethylenetriamine (0.01) | Remainder | 508 | 13 | 39 | 0.15 |
| 136 | 60 | F1 (0.07) | Tetraethylenepentamine (0.8) | Remainder | 508 | 32 | 16 | 0.09 |
| 137 | 60 | F1 (0.07) | Pentaethylenehexamine (0.5) | Remainder | 478 | 30 | 16 | 0.08 |
| 138 | 60 | F1 (0.07) | Polydiallylamine Mw. 3000 (0.03) | Remainder | 489 | 9 | 54 | 0.15 |
| 139 | 60 | F2 (0.2) | PVAm Mw. 5000 (0.01) | Remainder | 811 | 29 | 28 | 0.10 |
| 140 | 60 | F2 (0.2) | PAAm Mw. 3000 (0.5) | Remainder | 812 | 40 | 20 | 0.09 |
| 141 | 60 | F2 (0.2) | Diethylenetriamine (0.5) | Remainder | 788 | 47 | 17 | 0.09 |
| 142 | 60 | F2 (0.2) | Polydiallylamine Mw. 3000 (0.01) | Remainder | 820 | 21 | 39 | 0.01 |
| 143 | 60 | F3 (0.6) | PVAm Mw. 4000 (0.3) | Remainder | 714 | 45 | 16 | 0.18 |
| 144 | 60 | F3 (0.6) | PAAm Mw. 3000 (0.02) | Remainder | 715 | 38 | 19 | 0.02 |
| 145 | 60 | F3 (0.6) | Diethylenetriamine (0.5) | Remainder | 691 | 12 | 58 | 0.09 |
| 146 | 60 | F3 (0.6) | Polydiallylamine Mw. 1000 (0.03) | Remainder | 693 | 21 | 33 | 0.04 |
| 147 | 60 | F3 (0.6) | PEI Mw. 3000 (0.05) | Remainder | 701 | 35 | 20 | 0.01 |
| 148 | 60 | F2 (0.2) | PEI Mw. 5000 (0.5) | Remainder | 791 | 48 | 16 | 0.12 |
| 149 | 60 | F4 (0.4) | PAAm Mw. 3000 (0.03) | Remainder | 601 | 33 | 18 | 0.05 |
| 150 | 60 | F5 (0.6) | Diethylenetriamine (0.5) | Remainder | 701 | 18 | 39 | 0.18 |
| 151 | 60 | F3 (0.4) | Tetraethylenepentamine (0.8) | Remainder | 519 | 19 | 27 | 0.08 |
| 152 | 60 | F6 (0.7) | PVI Mw. 600 (0.03) | Remainder | 821 | 29 | 28 | 0.12 |
| C01 | 60 | F1 (0.02) | — | Remainder | 102 | 9 | 11 | 1.00 |
| C02 | 60 | F1 (0.05) | — | Remainder | 284 | 42 | 7 | 1.11 |
| C03 | 60 | F1 (0.1) | — | Remainder | 784 | 120 | 7 | 1.00 |
| C04 | 60 | F2 (0.05) | — | Remainder | 103 | 10 | 10 | 1.02 |
| C05 | 60 | F2 (0.1) | — | Remainder | 292 | 36 | 8 | 1.00 |
| C06 | 60 | F2 (0.2) | — | Remainder | 818 | 91 | 9 | 1.05 |
| C07 | 60 | F2 (0.5) | — | Remainder | 2984 | 329 | 9 | 0.95 |
| C08 | 60 | F1 (0.1) | Polystyrene Mw. 2000 (0.01) | Remainder | 510 | 149 | 3 | 0.80 |
| C09 | 60 | F1 (0.1) | Arginine (0.01) | Remainder | 578 | 150 | 4 | 0.90 |

<Notes in Tables>

The unit of the concentration of nitric acid is % by mass.

The value in parentheses in the fluorine-containing compound indicates the concentration (% by mass).

The value in parentheses in the nitrogen-containing organic compound indicates the concentration (% by mass).

ER indicates the etching rate.

F1: hydrofluoric acid
F2: ammonium fluoride
F3: tetrafluoroboric acid
F4: tetramethylammonium fluoride
F5: tetrabutylammonium fluoride
F6: hexafluorophosphoric acid
PEI: polyethyleneimine
PVAm: polyvinylamine
PAAm: polyallylamine
PVI: polyvinylimidazole
PDMA: polydimethyl diallyl ammonium
Mw: weight average molecular weight
1 Å=0.1 nm Example 2

Figure 3:
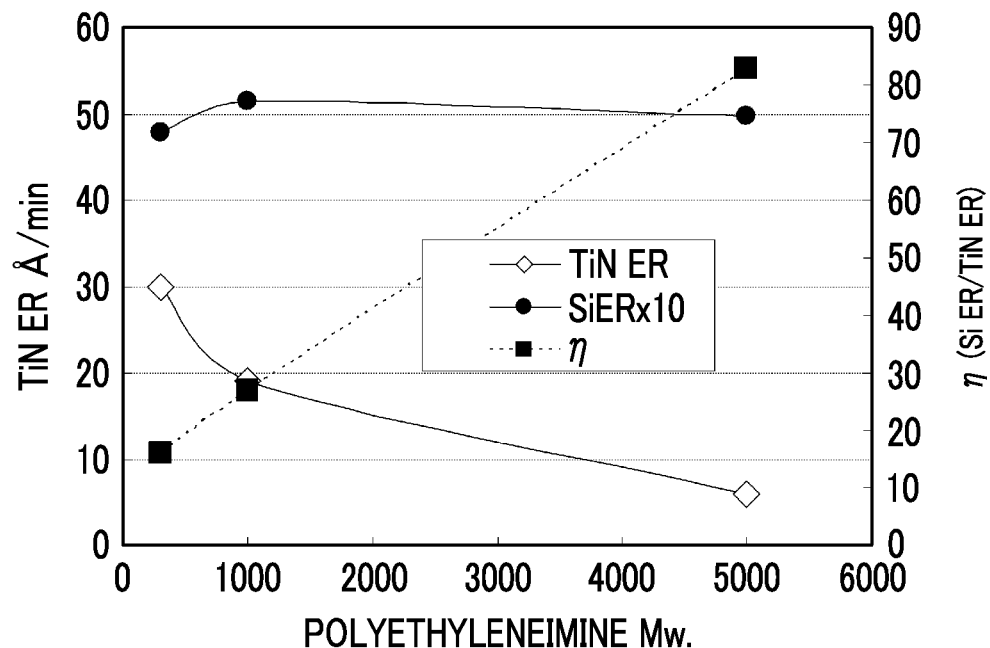
FIG. 3 is a graph showing a relationship between an etching rate evaluated in examples, a ratio (η) between the etching rates, and a molecular weight of a nitrogen-containing organic compound.

In order to examine the relationship between the ratio (η) of the etching rate of the amorphous silicon layer to that of the TiN layer and the molecular weight of the nitrogen-containing organic compound (PEI), tests based on Table 2 were extracted and compared to each other. FIG. 3 is a graph collectively showing the results thereof

TABLE 2

| No. | Molecular weight of nitrogen-containing organic compound (Mw.) | a-SiER (Å/min) | TiNER (Å/min) | η | Ra (nm) |
|---|---|---|---|---|---|
| 101 | 300 | 479 | 30 | 16 | 0.11 |
| 102 | 1000 | 514 | 19 | 27 | 0.10 |
| 103 | 5000 | 497 | 6 | 83 | 0.10 |

The notes in Table are the same as those in Table 1.

According to the present invention, as shown from the results described above, it is understood that the ratio (η) of the etching rate can be changed by being controlled using the molecular weight of the nitrogen-containing organic compound. Particularly, a distinctive feature is that the ratio η is changed without the SiER being decreased while the surface roughness is suppressed.

Example 3

Figure 4:
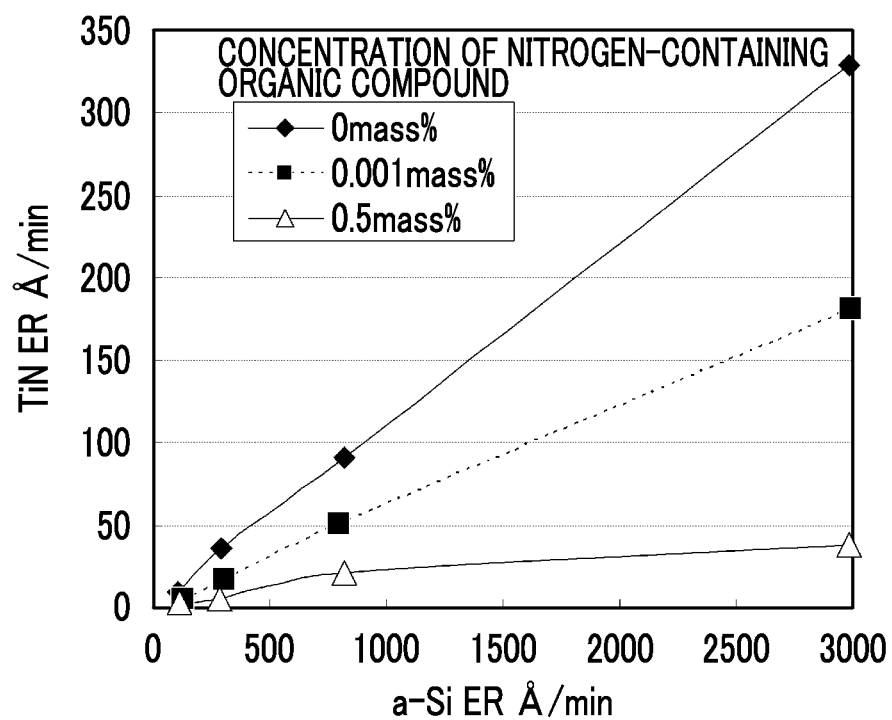
FIG. 4 is a graph showing a relationship between the etching rate evaluated in the examples and the concentration of the nitrogen-containing organic compound.

In order to examine the relationship between the ratio (η) of the etching rate of the amorphous silicon layer to that of the TiN layer and the concentration of the nitrogen-containing organic compound, tests based on Table 3 were extracted and compared to each other. FIG. 4 is a graph collectively showing the results thereof.

TABLE 3

| No. | Concentration of nitric acid (% by mass) | Concentration of fluorine-containing compound (% by mass) | Concentration of nitrogen-containing organic compound (% by mass) | a-SiER (Å/min) | TiNER (Å/min) | η |
|---|---|---|---|---|---|---|
| C04 | 60 | 0.05 | 0 | 103 | 10 | 10 |
| C05 | 60 | 0.1 | 0 | 292 | 36 | 8 |
| C06 | 60 | 0.2 | 0 | 818 | 91 | 9 |
| C07 | 60 | 0.5 | 0 | 2984 | 329 | 9 |
| 107 | 60 | 0.05 | 0.001 | 124 | 5 | 25 |
| 109 | 60 | 0.1 | 0.001 | 309 | 17 | 18 |
| 111 | 60 | 0.2 | 0.001 | 796 | 51 | 16 |
| 113 | 60 | 0.5 | 0.001 | 2992 | 181 | 17 |
| 108 | 60 | 0.05 | 0.5 | 111 | 3 | 37 |
| 110 | 60 | 0.1 | 0.5 | 281 | 5 | 56 |
| 112 | 60 | 0.2 | 0.5 | 823 | 21 | 39 |
| 114 | 60 | 0.5 | 0.5 | 2982 | 38 | 78 |

According to the present invention, as shown from the results described above, it is understood that the ratio (η) of the etching rate can be changed by being controlled using the concentration of the nitrogen-containing organic compound. Particularly, the etching rate can be adjusted in a wide range and controlled to be in the lower right area (right triangle area) of the line indicating 0% by mass in the graph. Further, a distinctive feature is that the ratio η is changed without the etching rate of the silicon-containing layer being decreased even when the nitrogen-containing organic compound is added.

Example 4

The etching test was performed in the same manner as in Example 1 except that the amorphous silicon layer of Example 1 described above was changed to a polycrystalline silicon layer. From the results, in the same manner as in Example 1, excellent etching properties, the properties of adjusting and controlling the ratio (η) of the etching rate, and the properties of suppressing the surface roughness were verified. Representative examples are listed in Table 4.

TABLE 4

| No. | Concentration of nitric acid | Fluorine-containing compound | Nitrogen-containing organic compound | Water | a-SiER (Å/min) | Poly-SiER (Å/min) | TiNER (Å/min) | η | Ra (nm) |
|---|---|---|---|---|---|---|---|---|---|
| 201 (102) | 60 | F1 (0.07) | PEI Mw. 1000 (0.01) | Remainder | 514 | 552 | 19 | 29 | 0.12 |
| 202 (110) | 60 | F2 (0.1) | PEI Mw. 2000 (0.5) | Remainder | 281 | 436 | 5 | 87 | 0.11 |
| 203 (117) | 60 | F1 (0.05) | PAAm Mw. 3000 (0.001) | Remainder | 309 | 407 | 15 | 27 | 0.08 |
| 204 (144) | 60 | F3 (0.6) | PAAm Mw. 3000 (0.02) | Remainder | 715 | 840 | 38 | 22 | 0.09 |

The notes in Table are the same as those in Table 1.
The parentheses in the test No. indicates the test number of Example 1 in which the corresponding liquid chemical was used.
a-SiER and TiNER indicate the corresponding results in Example 1 (Table 1).

Example 5

The etching test was performed in the same manner as in Example 1 except that the nitrogen-containing organic compound was changed to a phosphorus-containing compound in Table 5 below. As a result, excellent etching selectivity (η) and surface roughness (smoothness) (Ra) were obtained.

TABLE 5

| No. | Concentration of nitric acid | Fluorine-containing compound | Phosphorus-containing compound | Water | a-SiER (Å/min) | TiNER (Å/min) | η | Ra (nm) |
|---|---|---|---|---|---|---|---|---|
| 301 | 60 | F1 (0.08) | Phosphoric acid (0.2) | Remainder | 612 | 11 | 55 | 0.08 |
| 302 | 60 | F2 (0.2) | Phosphonic acid (0.1) | Remainder | 801 | 45 | 18 | 0.12 |
| 303 | 60 | F4 (0.4) | Phenylphosphonic acid (0.05) | Remainder | 588 | 10 | 59 | 0.11 |
| 304 | 60 | F1 (0.07) | Dodecylphosphoric acid (0.01) | Remainder | 512 | 8 | 64 | 0.13 |
| 305 | 60 | F2 (0.2) | Phosphoric acid (0.3) | Remainder | 804 | 14 | 57 | 0.05 |
| 306 | 60 | F2 (0.1) | Phosphoric acid (2.5) | Remainder | 299 | 5 | 60 | 0.15 |
| 307 | 60 | F3 (0.6) | Phosphoric acid (0.001) | Remainder | 701 | 39 | 18 | 0.16 |

TABLE 5-continued

| No. | Concentration of nitric acid | Fluorine-containing compound | Phosphorus-containing compound | Water | a-SiER (Å/min) | TiNER (Å/min) | η | Ra (nm) |
|---|---|---|---|---|---|---|---|---|
| 308 | 60 | F3 (0.6) | 1-Hydroxyethane-1,1-bis(phosphonic acid) (0.1) | Remainder | 722 | 12 | 60 | 0.14 |
| 309 | 60 | F6 (0.7) | Phosphoric acid (0.2) | Remainder | 832 | 15 | 55 | 0.09 |
| 310 | 60 | F5 (0.6) | Diphosphoric acid (0.02) | Remainder | 669 | 12 | 56 | 0.1 |

The notes in Table are the same as those in Table 1.

In this case, the parentheses in the fluorine-containing compound and the phosphorus-containing compound indicate the concentration (% by mass).

Example 6

Next, the influence of the blending amount of the phosphorus-containing compound on the etching selectivity was verified. As a result, it is understood that the etching selectivity (η) can be improved by increasing the amount of the phosphorus-containing compound and etching can be performed on the silicon-containing layer and the titanium-containing layer by controlling the amount thereof.

TABLE 6

| No. | Concentration of nitric acid | Fluorine-containing compound | Phosphorus-containing compound | Water | a-SiER (Å/min) | TiNER (Å/min) | η | Ra (nm) |
|---|---|---|---|---|---|---|---|---|
| 401 | 65 | F2 (0.2) | Phosphoric acid (0.01) | Remainder | 785 | 65 | 12 | 0.15 |
| 402 | 65 | F2 (0.2) | Phosphoric acid (0.1) | Remainder | 794 | 40 | 20 | 0.11 |
| 403 | 65 | F2 (0.2) | Phosphoric acid (0.3) | Remainder | 804 | 23 | 35 | 0.05 |
| 404 | 65 | F2 (0.2) | Phosphoric acid (1.2) | Remainder | 810 | 18 | 45 | 0.08 |
| 405 | 65 | F2 (0.2) | Phosphoric acid (3.0) | Remainder | 808 | 15 | 54 | 0.10 |
| 501 | 65 | F2 (0.2) | Phosphonic acid (0.01) | Remainder | 787 | 78 | 10 | 0.10 |
| 502 | 65 | F2 (0.2) | Phosphonic acid (0.1) | Remainder | 801 | 45 | 18 | 0.12 |
| 503 | 65 | F2 (0.2) | Phosphonic acid (0.5) | Remainder | 805 | 27 | 30 | 0.08 |
| 504 | 65 | F2 (0.2) | Phosphonic acid (1.2) | Remainder | 810 | 24 | 34 | 0.05 |
| 505 | 65 | F2 (0.2) | Phosphonic acid (3.0) | Remainder | 807 | 20 | 40 | 0.11 |

The notes in Table are the same as those in Table 1.

In this case, the parentheses in the fluorine-containing compound and the phosphorus-containing compound indicate the concentration (% by mass).

As understood from the results of Table 5 described above, in the preferred embodiment of the present invention, it can be understood that excellent etching selectivity of the silicon-containing layer can be obtained even when the phosphorus-containing compound is used. Further, as shown from the results of Table 6, it can be understood that the etching selectivity (η) can be controlled by changing the amount of the phosphorus-containing compound.

Example 7

0.01% by mass of the following compound was further added to each of the tests 301 to 310 and 401 to 405. As a result of verifying the performance of the etching rates of TiN and a-Si using the liquid chemical, improvement effects in the ratio between the etching rates and the surface roughness similar to those in the test 101 were verified.

AMIET 102 (manufactured by KAO Corporation) polyoxyethylene lauryl amine

Example 8

0.01% by mass of the following compound was further added to each of the tests 301 to 310 and 401 to 405. As a result of verifying the performance of the etching rates of TiN and a-Si using the liquid chemical, improvement effects in the ratio between the etching rates and the surface roughness similar to those in the test 101 were verified.

SURFLON S-141 (manufactured by AGC SEIMI CHEMICAL CO., LTD.) perfluoroalkyl compound The present invention has been described with reference to the embodiments, but the detailed description of the invention is not limited unless otherwise noted and the present invention should be broadly interpreted without departing from the spirit and the scope described in the aspects of the invention.

EXPLANATION OF REFERENCES

11: treatment container (treatment tank)
12: rotary table
13: ejection opening
14: junction point
M: rotation driving unit
S: substrate
t: movement locus line

What is claimed is:

1. An etching liquid comprising:
   nitric acid;
   a fluorine-containing compound; and
   a nitrogen-containing organic compound A containing a nitrogen atom, wherein the nitrogen-containing organic compound is a compound including a repeating unit represented by any one of the following Formulae a-2 to a-8 or a compound represented by the following Formula b,

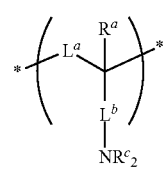

a-2

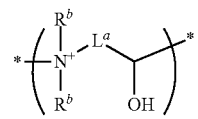

a-3

-continued

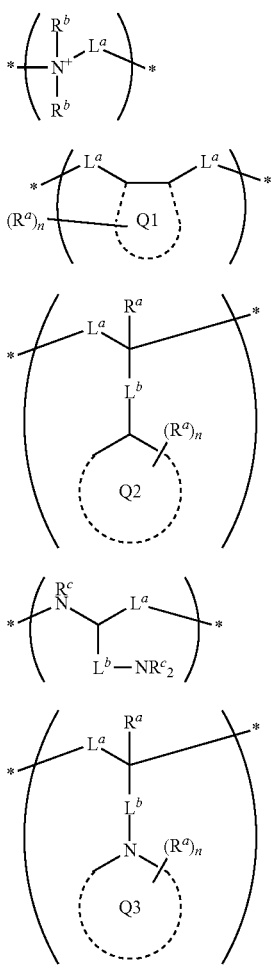

$R^a$ represents a hydrogen atom, an alkyl group, an alkenyl group, an aryl group, or a heterocyclic group, $R^b$ represents an alkyl group, an alkenyl group, or an aryl group, $L^a$ represents an alkylene group, a carbonyl group, an imino group, an arylene group, a heterocyclic group, or a combination of these, $L^b$ represents a single bond, an alkylene group, a carbonyl group, an imino group, an arylene group, a heterocyclic group, or a combination of these, $R^c$ represents a hydrogen atom or an alkyl group, n represents an integer of 0 or greater, the upper limit of n is a number of respective substitutable cyclic structural portions, rings Q1 to Q3 represent a nitrogen-containing heterocycle, and the symbol "*" in the formula indicates a binding position, $R^c{}_2N\text{-}[L^d\text{-}N(R^c)]_m\text{-}L^d\text{-}NR^c{}_2$   b in the formula, $R^c$ has the same definition as that described above, m represents an integer of 0 or greater, $L^d$ represents an alkylene group, a carbonyl group, an imino group, an arylene group, a heterocyclic group, or a combination of these, a plurality of $R^c$'s and $L^d$'s may be the same as or different from each other, and a plurality of $R^c$'s and $L^d$'s may be bonded to each other to form a ring.

2. The etching liquid according to claim 1, wherein the molecular weight of the nitrogen-containing organic compound is in the range of 100 to 20,000.

3. The etching liquid according to claim 1, wherein the molecular weight of the nitrogen-containing organic compound is in the range of 1,000 to 20,000.

4. The etching liquid according to claim 1, wherein 0.01 parts by mass to 25 parts by mass of the nitrogen-containing organic compound is contained based on 100 parts by mass of the fluorine-containing compound.

5. The etching liquid according to claim 1, wherein the concentration of the nitrogen-containing organic compound is in the range of 0.0001% by mass to 5% by mass.

6. The etching liquid according to claim 1,
wherein the nitrogen-containing organic compound is polyvinylamine, polyallylamine, polyvinylimidazole, polyhexadimethrine, poly(4-vinylpyridine), polyhistidine, polyarginine, polydimethyl diallyl ammonium, polylysine, polyornithine, diethylenetriamine, tetraethylenepentamine, pentaethylenehexamine, or polydiallylamine.

7. The etching liquid according to claim 1, wherein the fluorine-containing compound is selected from a group consisting of hydrofluoric acid, ammonium fluoride, tetramethylammonium fluoride, tetrafluoroboric acid, hexafluorophosphoric acid, hexafluorosilicic acid, ammonium tetrafluoroborate, ammonium hexafluorophosphate, and ammonium hexafluorosilicate.

8. The etching liquid according to claim 1, wherein the concentration of the nitric acid is in the range of 10% by mass to 95% by mass.

9. The etching liquid according to claim 1, wherein the concentration of the fluorine-containing compound is in the range of 0.001% by mass to 10% by mass.

10. The etching liquid according to claim 1, wherein the etching liquid is able to remove both a titanium-containing layer and a silicon-containing layer.

11. The etching liquid according to claim 10, wherein the ratio obtained by dividing the etching rate of the silicon-containing layer by the etching rate of the titanium-containing layer is adjusted to be in the range of 1000 to 0.1.

12. The etching liquid according to claim 11, wherein the ratio between the etching rates is adjusted by any one of the following means a to d or a combination of these,
  a: the ratio between the etching rates is increased by increasing the molecular weight of the nitrogen-containing organic compound;
  b: the ratio between the etching rates is increased by increasing the concentration of the nitrogen-containing organic compound;
  c: the etching rate of the titanium-containing layer and the etching rate of the silicon-containing layer are both increased by increasing the concentration of the fluorine-containing compound; and
  d: the etching rate of the titanium-containing layer and the etching rate of the silicon-containing layer are both increased by increasing the concentration of the nitric acid.

13. An etching method comprising:
bringing the etching liquid according to claim 1 into contact with a titanium-containing layer and a silicon-containing layer to remove the titanium-containing layer and the silicon-containing layer.

14. The etching method according to claim 13, wherein the silicon-containing layer is a layer containing polycrystalline silicon or a layer containing amorphous silicon.

15. The etching method according to claim 13, wherein the titanium-containing layer is a layer containing titanium nitride.

16. The etching method according to claim 13, wherein the ratio obtained by dividing the etching rate of the silicon-containing layer by the etching rate of the titanium-containing layer is adjusted to be in the range of 1000 to 0.1.

17. The etching method according to claim 16, wherein the ratio between the etching rates is adjusted by any one of the following means a to d or a combination of these, a: the ratio between the etching rates is increased by increasing the molecular weight of the nitrogen-containing organic compound;
b: the ratio between the etching rates is increased by increasing the concentration of the nitrogen-containing organic compound;
c: the etching rate of the titanium-containing layer and the etching rate of the silicon-containing layer are both increased by increasing the concentration of the fluorine-containing compound; and
d: the etching rate of the titanium-containing layer and the etching rate of the silicon-containing layer are both increased by increasing the concentration of the nitric acid.

18. A method for producing a semiconductor substrate product which is produced through a process of removing the titanium-containing layer and the silicon-containing layer using the etching method according to claim 13.

19. A method for manufacturing a semiconductor element which is manufactured through the method of producing a semiconductor substrate product according to claim 18.

20. A kit of an etching liquid which is a combination of a first liquid containing nitric acid and a second liquid containing a fluorine-containing compound and a nitrogen-containing organic compound A, which includes a plurality of repeating units containing a nitrogen atom, wherein the nitrogen-containing organic compound is a compound including a repeating unit represented by any one of the following Formulae a-2 to a-8 or a compound represented by the following Formula b,

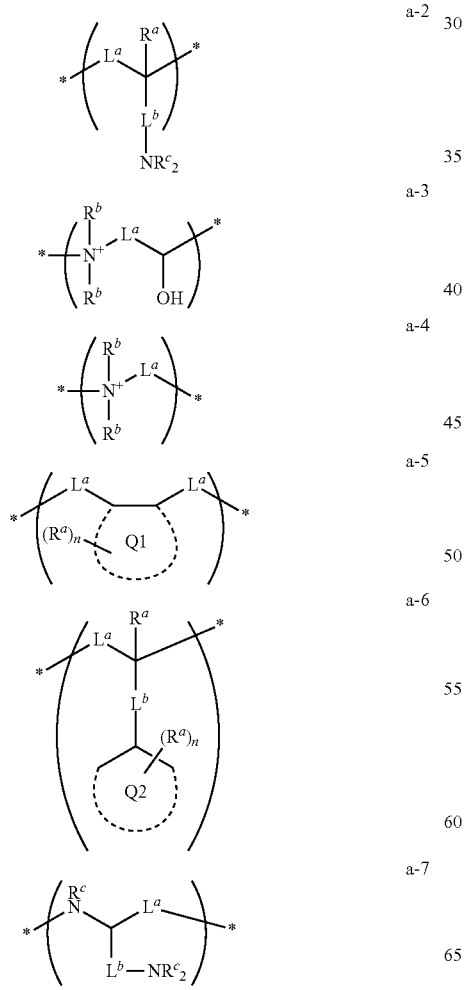

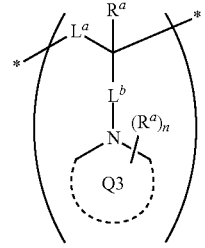

$R^a$ represents a hydrogen atom, an alkyl group, an alkenyl group, an aryl group, or a heterocyclic group, $R^b$ represents an alkyl group, an alkenyl group, or an aryl group, $L^a$ represents an alkylene group, a carbonyl group, an imino group, an arylene group, a heterocyclic group, or a combination of these, $L^b$ represents a single bond, an alkylene group, a carbonyl group, an imino group, an arylene group, a heterocyclic group, or a combination of these, $R^c$ represents a hydrogen atom or an alkyl group, n represents an integer of 0 or greater, the upper limit of n is a number of respective substitutable cyclic structural portions, rings Q1 to Q3 represent a nitrogen-containing heterocycle, and the symbol "*" in the formula indicates a binding position, $$R^c_2N\text{-}[L^d\text{-}N(R^c)]_m\text{-}L^d\text{-}NR^c_2 \quad \text{b}$$

in the formula, $R^c$ has the same definition as that described above, m represents an integer of 0 or greater, $L^d$ represents an alkylene group, a carbonyl group, an imino group, an arylene group, a heterocyclic group, or a combination of these, a plurality of $R^c$'s and $L^d$'s may be the same as or different from each other, and a plurality of $R^c$'s and $L^d$'s may be bonded to each other to form a ring.

21. An etching liquid comprising:
nitric acid;
a fluorine-containing compound; and
a nitrogen-containing organic compound A containing a nitrogen atom,
wherein a content of the nitric acid is 10% by mass or more and 95% by mass or less, based on the total mass of the etching liquid,
wherein the nitrogen-containing organic compound is a compound including a repeating unit represented by any one of the following Formulae a-1 to a-8 or a compound represented by the following Formula b,

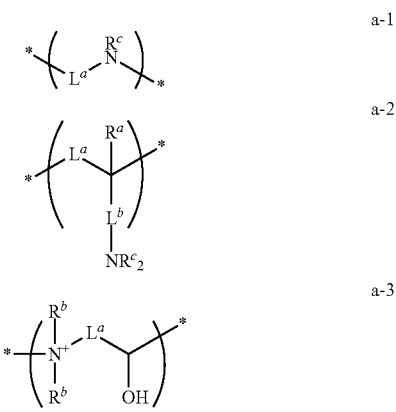

-continued

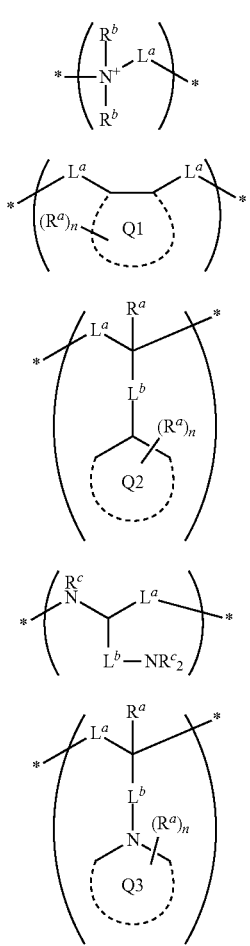

a-4 a-5 a-6 a-7 a-8

$R^a$ represents a hydrogen atom, an alkyl group, an alkenyl group, an aryl group, or a heterocyclic group, $R^b$ represents an alkyl group, an alkenyl group, or an aryl group, $L^a$ represents an alkylene group, a carbonyl group, an imino group, an arylene group, a heterocyclic group, or a combination of these, $L^b$ represents a single bond, an alkylene group, a carbonyl group, an imino group, an arylene group, a heterocyclic group, or a combination of these, $R^c$ represents a hydrogen atom or an alkyl group, n represents an integer of 0 or greater, the upper limit of n is a number of respective substitutable cyclic structural portions, rings Q1 to Q3 represent a nitrogen-containing heterocycle, and the symbol "*" in the formula indicates a binding position,

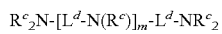

b in the formula, $R^c$ has the same definition as that described above, m represents an integer of 0 or greater, $L^d$ represents an alkylene group, a carbonyl group, an imino group, an arylene group, a heterocyclic group, or a combination of these, a plurality of $R^c$'s and $L^d$'s may be the same as or different from each other, and a plurality of $R^c$'s and $L^d$'s may be bonded to each other to form a ring.

22. An etching liquid comprising:
nitric acid;
a fluorine-containing compound; and
a nitrogen-containing organic compound A containing a nitrogen atom, or a phosphorus-containing compound B, wherein a content of the nitric acid is 10% by mass or more and 95% by mass or less, based on the total mass of the etching liquid and a concentration of the phosphorus-containing compound B in the etching liquid is 0.0001% by mass or more and 3% by mass or less, wherein the nitrogen-containing organic compound is a compound including a repeating unit represented by any one of the following Formulae a-1 to a-8 or a compound represented by the following Formula b,

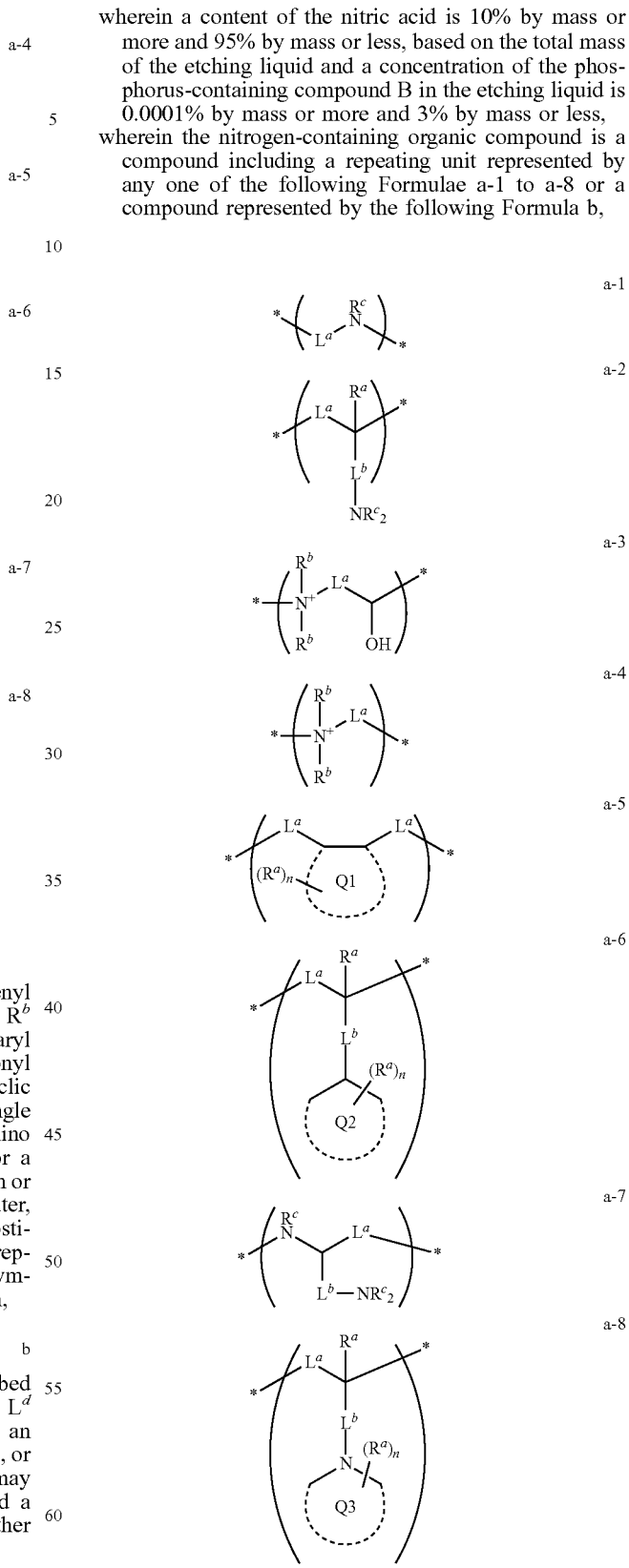

$R^a$ represents a hydrogen atom, an alkyl group, an alkenyl group, an aryl group, or a heterocyclic group, $R^b$ represents an alkyl group, an alkenyl group, or an aryl group, $L^a$ represents an alkylene group, a carbonyl group, an imino group, an arylene group, a heterocyclic group, or a combination of these, $L^b$ represents a single bond, an alkylene group, a carbonyl group, an imino group, an arylene group, a heterocyclic group, or a combination of these, $R^c$ represents a hydrogen atom or an alkyl group, n represents an integer of 0 or greater, the upper limit of n is a number of respective substitutable cyclic structural portions, rings Q1 to Q3 represent a nitrogen-containing heterocycle, and the symbol "*" in the formula indicates a binding position, $$R^c{}_2N\text{-}[L^d\text{-}N(R^c)]_m\text{-}L^d\text{-}NR^c{}_2 \qquad b$$

in the formula, $R^c$ has the same definition as that described above, m represents an integer of 0 or greater, $L^d$ represents an alkylene group, a carbonyl group, an imino group, an arylene group, a heterocyclic group, or a combination of these, a plurality of $R^c$'s and $L^d$'s may be the same as or different from each other, and a plurality of $R^c$'s and $L^d$'s may be bonded to each other to form a ring.

\* \* \* \* \*